(12) United States Patent
Park et al.

(10) Patent No.: US 11,250,911 B2
(45) Date of Patent: Feb. 15, 2022

(54) NONVOLATILE MEMORY DEVICE AND OPERATING METHOD OF THE SAME

(71) Applicant: Samsung Electronics Co., Ltd., Suwon-si (KR)

(72) Inventors: Jong-chul Park, Hwaseong-si (KR); Youn-yeol Lee, Seoul (KR); Seul-bee Lee, Hwaseong-si (KR); Kyung-sub Lim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/196,039

(22) Filed: Mar. 9, 2021

(65) Prior Publication Data
US 2021/0193225 A1 Jun. 24, 2021

Related U.S. Application Data

(63) Continuation-in-part of application No. 17/113,939, filed on Dec. 7, 2020, now Pat. No. 11,164,631, which is a continuation of application No. 16/458,222, filed on Jul. 1, 2019, now Pat. No. 10,885,983.

(30) Foreign Application Priority Data

Oct. 18, 2018 (KR) ........................ 10-2018-0124579

(51) Int. Cl.
G11C 16/04 (2006.01)
G11C 11/56 (2006.01)
(Continued)

(52) U.S. Cl.
CPC ...... *G11C 16/0483* (2013.01); *G11C 11/5671* (2013.01); *G11C 16/08* (2013.01);
(Continued)

(58) Field of Classification Search
CPC ..... G11C 16/0483; G11C 16/08; G11C 16/10; G11C 16/12; G11C 16/16; G11C 11/5671; H01L 27/11582
(Continued)

(56) References Cited

U.S. PATENT DOCUMENTS 8,427,878 B2    4/2013  Shim et al.
8,570,808 B2 *  10/2013 Park ................. G11C 11/5642
                                                365/185.18
(Continued)

FOREIGN PATENT DOCUMENTS

KR       10-1117589 B1     2/2012
KR    10-2014-0009189 A    1/2014
(Continued)

*Primary Examiner* — Son L Mai
(74) *Attorney, Agent, or Firm* — Muir Patent Law, PLLC

(57) ABSTRACT

An operating method of a storage device comprising a nonvolatile memory device comprising a first memory stack and a second memory stack, and a memory controller coupled to control the nonvolatile memory device, the operating method includes determining a first read voltage level with which a first memory cell of the first memory stack is successfully read, and performing a read operation on a second memory cell of the second memory stack using a second read voltage determined based on the first read voltage level.

20 Claims, 26 Drawing Sheets

(51) Int. Cl.
  *H01L 27/11582* (2017.01)
  *G11C 16/10* (2006.01)
  *G11C 16/12* (2006.01)
  *G11C 16/08* (2006.01)
  *G11C 16/26* (2006.01)

(52) U.S. Cl.
  CPC .............. *G11C 16/10* (2013.01); *G11C 16/12* (2013.01); *G11C 16/26* (2013.01); *H01L 27/11582* (2013.01)

(58) Field of Classification Search
  USPC .......................... 365/185.03, 185.18, 185.28
  See application file for complete search history.

(56) References Cited

U.S. PATENT DOCUMENTS

| | | | | |
|---|---|---|---|---|
| 8,730,738 B2 * | 5/2014 | Oh | ..................... | G11C 16/3454 365/185.22 |
| 8,902,651 B2 * | 12/2014 | Kwak | ..................... | G11C 16/26 365/185.03 |
| 9,064,584 B2 * | 6/2015 | Jung | ........................ | G11C 5/02 |
| 9,305,654 B2 | 4/2016 | Parat et al. | | |
| 9,330,770 B2 * | 5/2016 | Shim | ....................... | G11C 16/12 |
| 9,378,831 B2 * | 6/2016 | Han | ....................... | G11C 16/08 |
| 9,397,110 B2 | 7/2016 | Lue | | |
| 9,570,176 B2 | 2/2017 | Jung et al. | | |
| 9,972,399 B2 * | 5/2018 | Seo | ..................... | G11C 16/0483 |
| 10,037,805 B2 * | 7/2018 | Martinozzi | ........... | G06F 3/0632 |
| 10,056,148 B2 | 8/2018 | Kwak et al. | | |
| 10,885,983 B2 | 1/2021 | Park et al. | | |
| 2013/0341701 A1 | 12/2013 | Blomme et al. | | |
| 2015/0103592 A1 | 4/2015 | Miwa | | |
| 2016/0293266 A1 | 10/2016 | Chen et al. | | |

FOREIGN PATENT DOCUMENTS

| | | |
|---|---|---|
| KR | 10-2016-0047661 A | 5/2016 |
| KR | 10-2017-0056072 A | 5/2017 |
| KR | 10-1742095 B1 | 5/2017 |

\* cited by examiner

| Wordline | Appl. Vol | |
|---|---|---|
| WL1 | V1_1~V1_4 | — AVT |
| WL2 | V2_1~V2_4 | |
| WL3 | V3_1~V3_4 | |
| WL4 | V4_1~V4_4 | |
| WL5 | V1_4 | |
| WL6 | V2_4 | |
| WL7 | V3_4 | |
| WL8 | V4_4 | |

FIG. 27

|  | CASE1 | CASE2 | CASE3 | CASE4 |
|---|---|---|---|---|
| MC2 POSITION | STA2 | STA1 | STB2 | STB1 |
| MC1 POSITION | STA1 | STA2 | STB1 | STB2 |

|  | CASE5 | CASE6 | CASE7 | CASE8 |
|---|---|---|---|---|
| MC2 POSITION | STB2 | STA1 | STA2 | STB1 |
| MC1 POSITION | STA1 | STB2 | STB1 | STA2 |

NONVOLATILE MEMORY DEVICE AND OPERATING METHOD OF THE SAME

CROSS-REFERENCE TO RELATED APPLICATION

This application is a continuation-in-part of U.S. application Ser. No. 17/113,939, filed on Dec. 7, 2020, which is a continuation of and claims priority to U.S. patent application Ser. No. 16/459,222 filed on Jul. 1, 2019, issued as U.S. Pat. No. 10,885,983, which claims the benefit of Korean Patent Application No. 10-2018-0124579, filed on Oct. 18, 2018 in the Korean Intellectual Property Office, the disclosure of which is incorporated herein in its entirety by reference.

BACKGROUND

The inventive concept relates to a nonvolatile memory device, and more particularly, to a nonvolatile memory including a plurality of memory stacks.

Semiconductor memory devices are memory devices implemented by using semiconductors such as silicon (Si), germanium (Ge), gallium arsenide (GaAs), and indium phosphide (InP). The semiconductor memory devices are classified into volatile memory devices and nonvolatile memory devices.

Nonvolatile memory devices are memory devices of which data stored therein do not disappear even when power supply is interrupted. Nonvolatile memory devices may include read-only memory (ROM), programmable ROM (PROM), erasable PROM (EPROM), electrically EPROM (EEPROM), flash memory device, phase-change random access memory (RAM) (PRAM), magneto-resistive RAM (MRAM), resistive RAM (RRAM), and ferroelectric RAM (FRAM), etc. Flash memory devices may be classified into a negative-OR (NOR)-type and a negative-AND (NAND)-type.

A nonvolatile memory device may have a 3D memory cell array, and a double stack structure has been developed which is generated by stacking a plurality of memory stacks generated through independent channel hole forming processes. In regard to a memory cell array of the double stack structure, an input/output method different from that of a conventional single stack structure has been used.

SUMMARY

According to an embodiment of the present invention, an operating method of a storage device comprising a nonvolatile memory device comprising a first memory stack and a second memory stack, and a memory controller coupled to control the nonvolatile memory device, the operating method includes determining a first read voltage level with which a first memory cell of the first memory stack is successfully read, and performing a read operation on a second memory cell of the second memory stack using a second read voltage determined based on the first read voltage level.

According to an embodiment of the present invention, a nonvolatile memory device includes a first memory stack comprising a plurality of first word lines stacked on each other, the number of the plurality of first word lines being K which is a natural number, a second memory stack comprising a plurality of second word lines stacked on each other, the second memory stack being stacked vertically on the first memory stack, and the number of the plurality of second word lines being N which is a natural number greater than K, and a control logic applying a second operating voltage to a second memory cell which is located at a first depth from an upper surface of the second memory stack. The second operating voltage is determined based on a first operating voltage applied to a first memory cell which is located at the first depth from an upper surface of the first memory stack.

According to an embodiment of the present invention, a nonvolatile memory device includes a first memory stack comprising a plurality of first word lines stacked on each other, the number of the plurality of first word lines being N, a second memory stack comprising a plurality of second word lines stacked on each other, the second memory stack being stacked vertically on the first memory stack and the number of the plurality of second word lines being K which is a natural number less than N, and a control logic applying a second operating voltage to a second memory cell which is located at a second depth from an upper surface of the second memory stack. The second operating voltage is determined based on a first operating voltage applied to a first memory cell which is located at the second depth from an upper surface of the first memory stack.

BRIEF DESCRIPTION OF THE DRAWINGS

Embodiments of the inventive concept will be more clearly understood from the following detailed description taken in conjunction with the accompanying drawings in which:

FIG. 27 is a table classifying cases of memory cells included in memory stacks according to an embodiment.

DETAILED DESCRIPTION OF EXEMPLARY EMBODIMENTS

Figure 1:
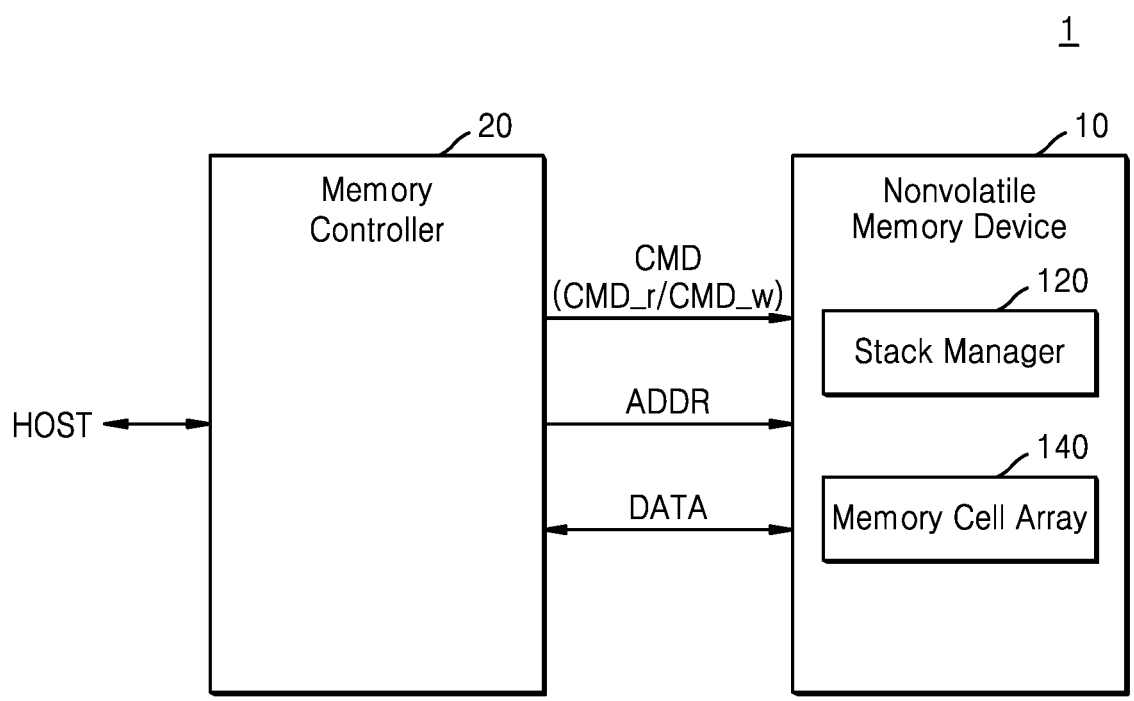
FIG. 1 is a block diagram illustrating a nonvolatile memory system according to an embodiment.

FIG. 1 is a block diagram illustrating a nonvolatile memory system 1 according to an embodiment. The values such as thickness and width of a constituent element or the shapes of the constituent element or voltages required to operate the constituent element may be expressed using "substantially the same", because the values or shapes of a semiconductor device fabricated according to the present inventive concept or voltages required to operate the semiconductor device may be different from the exact value claimed below due to a process variation for forming the semiconductor device. For example, memory stacks described below may be fabricated using the same process, but due to a process variation within a tolerable range, the memory stacks may not have exactly the same measurements, which is expressed using "substantially the same."

Referring to FIG. 1, the nonvolatile memory system 1 may include a memory controller 20 and a nonvolatile memory device 10. In an embodiment, each of a host HOST, the memory controller 20, and the nonvolatile memory device 10 may be provided in one chip, one package, one module, or the like. Alternatively, the memory controller 20 and the nonvolatile memory device 10 may be provided in a package such as package on package (PoP), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), thin quad flat pack (TQFP), system in package (SIP), multi-chip package (MCP), wafer-level fabricated package (WFP), and wafer-level processed stack package (WSP).

The memory controller 20 may control the nonvolatile memory device 10 in response to a write request or a read request received from the host HOST. For example, the memory controller 20 may transmit to the nonvolatile memory device 10 a command CMD and an address ADDR in response to the write request or the read request received from the host HOST. The address ADDR that the memory controller 20 transmits to the nonvolatile memory device 10 may be a physical address in the nonvolatile memory device 10. The memory controller 20 may exchange data DATA with the nonvolatile memory device 10. In an embodiment, when the command CMD is a write command CMD_w, the nonvolatile memory device 10 may write to a memory cell array 140 the data DATA received from the memory controller 20, and when the command CMD is a read command CMD_r, the nonvolatile memory device 10 may output to the memory controller 20 the data DATA stored in the address ADDR received from the memory controller 20.

The nonvolatile memory device 10 may include a stack manager 120 and the memory cell array 140. The memory cell array 140 may include a plurality of memory stacks, and the stack manager 120 may control a program operation and a read operation for a plurality of memory stacks. In the inventive concept, the program operation may denote a series of operations that cause a memory cell included in a memory cell array to have a certain threshold voltage to write data to the memory cell array, and the read operation may denote an operation of determining data stored in the memory cell array.

According to an embodiment, the stack manager 120 may determine an applied voltage for another stack by using an applied voltage for one of a plurality of memory stacks. The applied voltage may include a program voltage required for the program operation and a read voltage required for the read operation.

In the program operation, the nonvolatile memory device 10 may program the memory cell by applying a plurality of program voltages to the memory cell. According to an embodiment, the stack manager 120 may apply the plurality of program voltages to any one of the plurality of memory stacks and perform a program for another stack by using any one of the plurality of program voltages, and thus, may reduce the number of voltages applied to other stacks. Accordingly, the time required for the program operation may be reduced and the performance of the program operation may be increased. This is described later in detail with reference to FIG. 8 and the like.

In the read operation, when the data DATA read from the memory cell fails in an error correction, the nonvolatile memory device 10 may change a read voltage level by applying a plurality of read voltages. According to an embodiment, the stack manager 120 may apply the plurality of read voltages to any one of the plurality of memory stacks and perform the read operation for another stack by using any one of the plurality of read voltages, and thus, may reduce the number of voltages applied to other stacks. Accordingly, the time required for the read operation may be reduced and the performance of the read operation may be increased. This is described later in detail with reference to FIG. 12 and the like.

According to an embodiment, in the program operation, the stack manager 120 may alternately perform programs, among the plurality of memory stacks, for memory cells included in the plurality of memory stacks. Accordingly, the program operation for the memory cells having substantially the same channel hole characteristics may be performed at substantially the same speed. This is described later in detail with reference to FIG. 14 and the like.

According to an embodiment, the stack manager 120 may program the memory cells in a lower portion of the plurality of memory stacks in 1 bit, the memory cells in a middle portion in 2 bits, and the memory cells in an upper portion in 3 bits. This is described later in detail with reference to FIG. 17 and the like.

The memory cell array 140 may include the plurality of memory stacks each including the plurality of memory cells. For example, the plurality of memory cells may include flash memory cells. Hereinafter, embodiments are described for the case in which the plurality of memory cells include NAND flash memory cells. However, the embodiment is not limited thereto. In other embodiments, the plurality of memory cells may include resistive memory cells such as resistive read-only memories (RAMs) (RRAMs), phase-change RAMs (PRAMs), and magneto-resistive RAMs (MRAMs).

Each of the plurality of memory stacks may constitute a three-dimensional (3D) memory array. The 3D memory array may be monolithically formed on at least one physical level of memory cell arrays which include an active region on a silicon substrate and a circuit related with operation of the memory cells on or in the silicon substrate. The term "monolithic" may mean that layers of each level constituting the memory cell array are directly stacked above the layers of each lower level of the memory cell array. Each of the plurality of memory stacks may include NAND strings arranged in a vertical direction so that at least one memory cell is arranged on another memory cell. The at least one memory cell may include a charge trapping layer. The memory cell array 140 may have a double stack structure in which the plurality of memory stacks are stacked in a manner that channel holes are connected to each other. The double stack structure is described in detail later with reference to FIGS. 4 and 5.

The following patent documents, which are hereby incorporated by reference, disclose suitable configurations for three-dimensional memory arrays, in which a three-dimensional memory array is configured as a plurality of levels, with word lines and/or bit lines shared between the levels: U.S. Pat. Nos. 7,679,133; 8,553,466; 8,654,587; and 8,559,235; and US Pat. Pub. No. 2011/0233648. In addition, U.S. Pat. Nos. 2014/0334232; and 8,488,381 are hereby incorporated by reference.

In this embodiment, each memory cell included in the memory cell array 140 may be a multi-level cell (MLC) storing two or more bits of data. For example, the memory cell may be an MLC storing 2-bit data. As another example, the memory cell may be a triple level cell (TLC) for storing 3-bit data or a quadruple level cell (QLC) for storing 4-bit data. However, the inventive concept is not limited thereto. In other embodiments, some memory cells included in the memory cell array 140 may be single-level cells (SLCs) storing 1-bit data, and some other memory cells may be MLCs.

Figure 2:
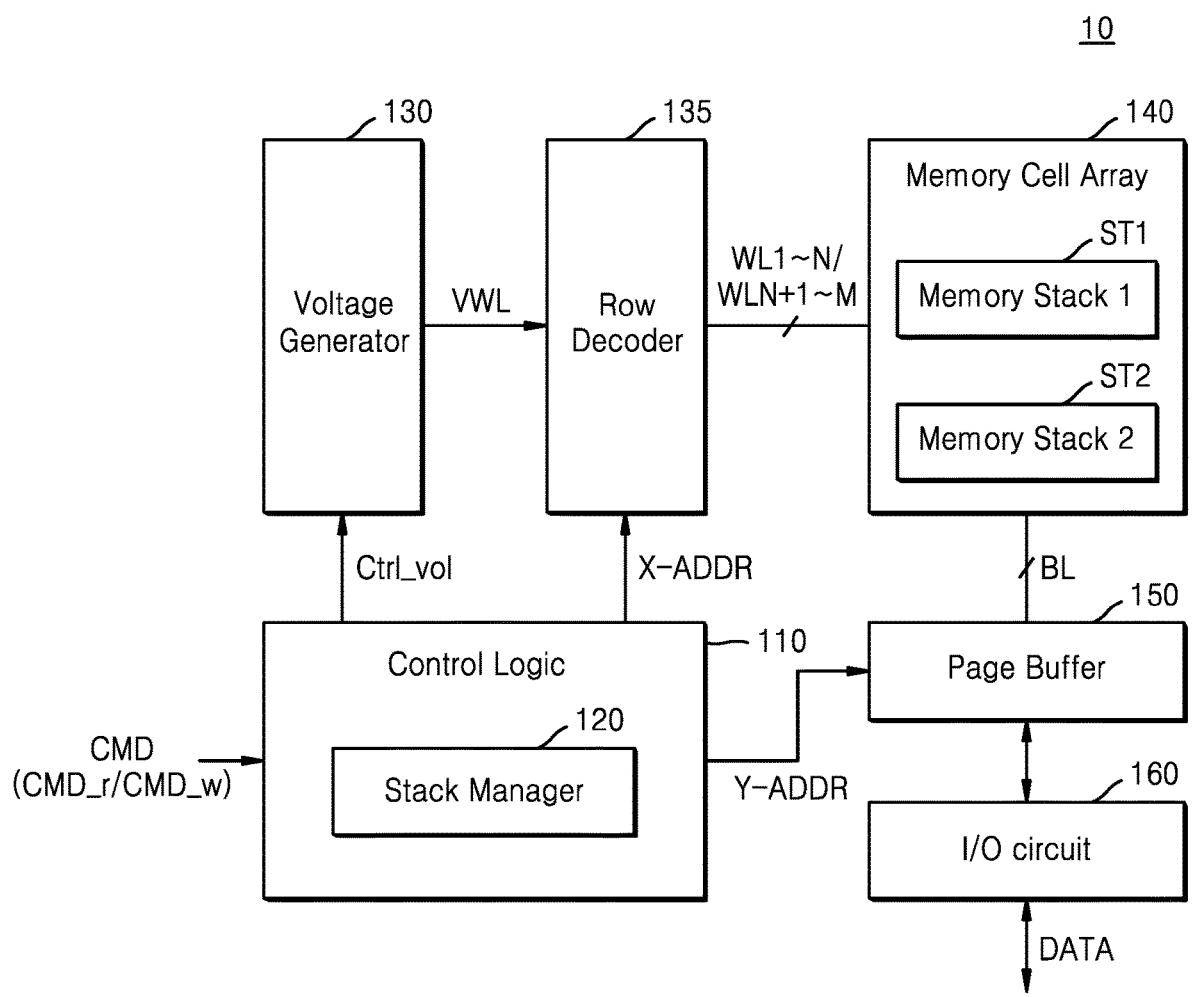
FIG. 2 is a block diagram illustrating a nonvolatile memory device according to an embodiment.

FIG. 2 is a block diagram illustrating the nonvolatile memory device 10 according to an embodiment. Descriptions already given above with reference to FIG. 1 are omitted.

Referring to FIG. 2, the nonvolatile memory device 10 may include a control logic 110, a page buffer 150, the memory cell array 140, a voltage generator 130, a row decoder 135, and an input/output (I/O) circuit 160.

The control logic 110 may include the stack manager 120. The control logic 110 may, based on the command CMD (or CMD_r/CMD_w) and the address ADDR received from the memory controller (20 in FIG. 1), output various control signals for writing the data DATA to the memory cell array 140 or reading the data DATA from the memory cell array 140.

The stack manager 120 may output various control signals (for example, a voltage control signal Ctrl_vol and a row address X-ADDR) for controlling each or all of a first memory stack ST1 and a second memory stack ST2. For convenience of explanation, that the stack manager 120 outputs to the voltage generator 130 the voltage control signal Ctrl_vol including information of the applied voltages for the plurality of first and second memory stacks ST1 and ST2 may be equivalent to that the stack manager 120 outputs various voltages to the plurality of first and second memory stacks ST1 and ST2.

In addition, for convenience of explanation, that the stack manager 120 outputs to the row decoder 135 the row address X-ADDR including address information of a word line WL connected to a selection memory cell to be programmed or read for the program operation or the read operation may be equivalent to that the stack manager 120 programs the selection memory cell included in the plurality of first and second memory stacks ST1 and ST2 or reads from the selection memory cell.

The memory cell array 140 may include the first memory stacks ST1 and the second memory stacks ST2 that are vertically stacked. The first memory stack ST1 may be connected to the row decoder 135 through first through $N^{th}$ (N is an integer of 1 or more) word lines WL1 through WLN, and the second memory stack ST2 may be connected to the row decoder 135 through $(N+1)^{th}$ through $M^{th}$ (M is an integer of N or more) word lines WLN+1 through WLM. The first memory stack ST1 and the second memory stack ST2 are described in detail later with reference to FIG. 4 and the like.

The voltage generator 130 may generate various kinds of voltages for performing the program operation, the read operation, and an erase operation for the memory cell array 140 based on the voltage control signal Ctrl_vol. The voltage generator 130 may generate word line voltages VWL, for example, a program voltage (or a write voltage), a read voltage, a pass voltage (or a word line non-selection voltage), a verify voltage, a recovery voltage, etc.

The row decoder 135 may select some word lines among the first through Mt" word lines WL1 through WLM in response to the row address X-ADDR. The row decoder 135 may transfer the word line voltages VWL to word lines. In the program operation, the row decoder 135 may apply the program voltage and the verify voltage to the selected word line and a program inhibit voltage to the unselected word line. In the read operation, the row decoder 135 may apply the read voltage to the selected word line and a read inhibit voltage to the unselected word line. In a recovery operation, the row decoder 135 may apply the recovery voltage to the selected word line. In addition, the row decoder 135 may select some string selection lines among the string selection lines or some ground selection lines among the ground selection lines in response to the row address X-ADDR.

The page buffer 150 may be connected to the memory cell array 140 via a bit line BL and may select the bit line BL based on a column address Y-ADDR received from the control logic 110. The I/O circuit 160 may receive the data DATA from the outside (for example, the memory controller 20 in FIG. 1) and store the input data DATA in the memory cell array 140, or may read the data DATA from the memory cell array 140 and output the read data DATA to the outside.

Figure 3:
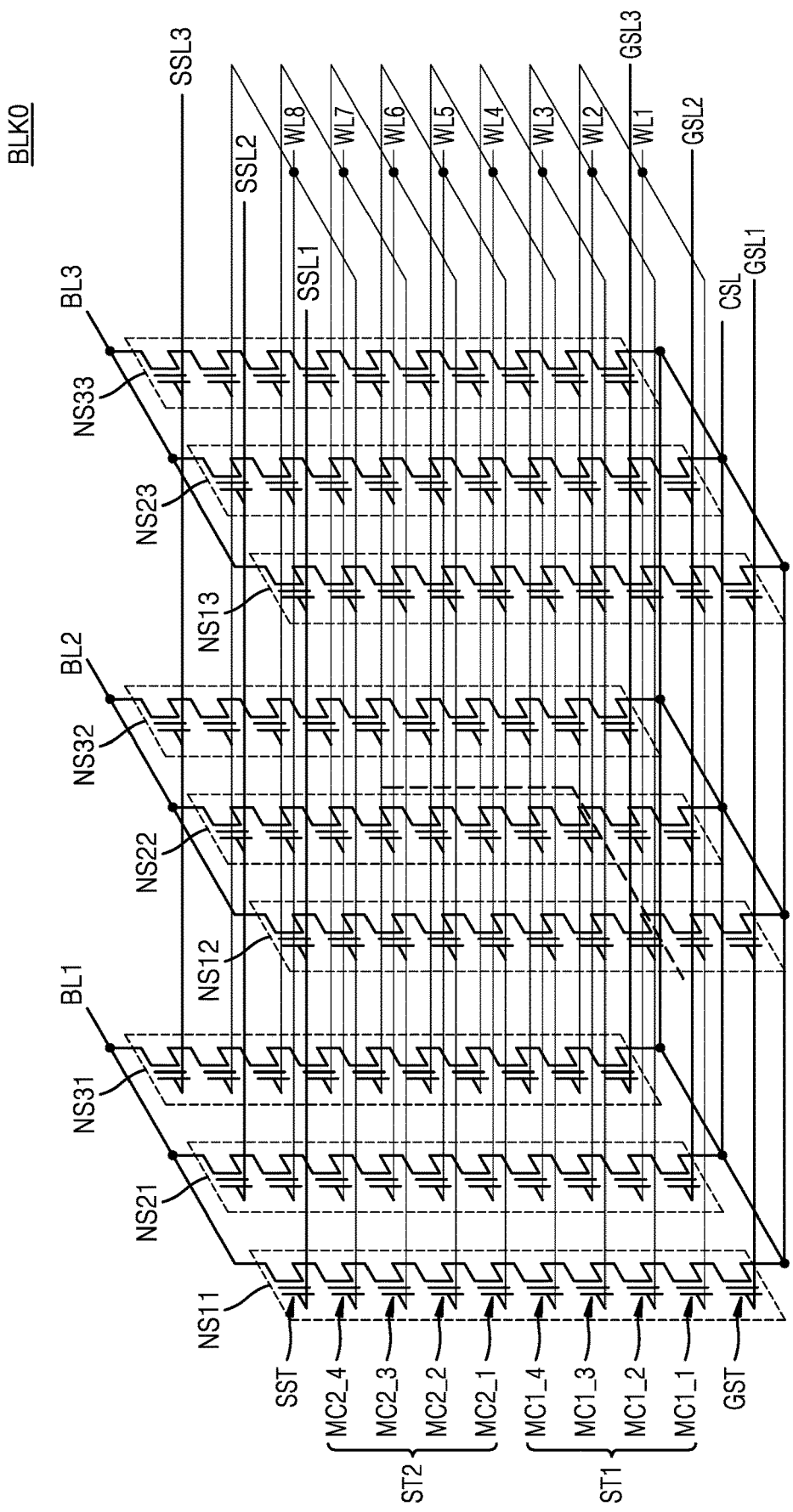
FIG. 3 is a circuit diagram illustrating a memory block included in a memory cell array according to an embodiment.

FIG. 3 is a circuit diagram illustrating a memory block BLK0 included in a memory cell array according to an embodiment.

Referring to FIG. 3, the memory cell array (for example, 140 in FIG. 2) may be a memory cell array of a vertical NAND flash memory and may include a plurality of memory blocks BLK0. Each memory block BLK0 may include a plurality of NAND strings (NS11 through NS33), a plurality of word lines (WL1 through WL8), a plurality of bit lines (BL1 through BL3), a plurality of ground selection lines (GSL1 through GSL3), a plurality of string selection lines (SSL1 through SSL3), and a common source line CSL. A plurality of first memory cells (MC1_1 through MC1_4) connected to the first through fourth word lines WL1 through WL4 may constitute the first memory stack ST1, and a plurality of second memory cells (MC2_1 through MC2_4) connected to the fifth through eighth lines WL5 through WL8 may constitute the second memory stack ST2. Here, the number of NAND cell strings, the number of word lines, the number of bit lines, the number of ground selection lines, the number of cell string selection lines, and the number of memory cells each constituting the first and second memory stacks ST1 and ST2 may be variously changed.

The NAND cell strings (NS11, NS21, and NS31) may be between the first bit line BL1 and the common source line CSL, the NAND cell strings (NS12, NS22, and NS32) may be between the second bit line BL2 and the common source line CSL, and the NAND cell strings (NS13, NS23, and NS33) may be between the third bit line BL3 and the common source line CSL. Each NAND cell string (for example, NS11) may include a cell string selection transistor SST, a plurality of memory cells (MC1 through MC8), and a ground selection transistor GST, which are connected in series.

Cell strings connected in common to one-bit line may constitute one column. For example, the cell strings (NS11, NS21, and NS31) commonly connected to the first bit line BL1 may correspond to a first column, the cell strings (NS12, NS22, and NS32) commonly connected to the second bit line BL2 may correspond to a second column, and the cell strings (NS13, NS23, and NS33) commonly connected to the third bit line BL3 may correspond to a third column.

The cell strings connected to one cell string selection line may constitute one row. For example, the cell strings (NS11, NS12, and NS13) connected to the first cell string selection line SSL1 may correspond to a first row, the cell strings (NS21, NS22, and NS23) connected to the second cell string selection line SSL2 may correspond to a second row, and the cell strings (NS31, NS32, and NS33) connected to the third cell string selection line SSL3 may correspond to a third row.

The cell string selection transistor SST may be connected to the corresponding cell string selection lines (SSL1 through SSL3). The plurality of memory cells (MC1_1 through MC2_4) may be connected to the corresponding word lines (WL1 through WL8), respectively. The ground selection transistor GST may be connected to the corresponding ground selection lines (GSL1 through GSL3). The cell string selection transistor SST may be connected to the corresponding bit lines (BL1 through BL3), and the ground selection transistor GST may be connected to the common source line CSL.

Word lines on the same level (for example, WL1) may be commonly connected to each other, while the string selection lines (SSL1 through SSL3) are apart from each other and the ground selection lines (GSL1 through GSL3) are apart from each other. For example, when memory cells connected to the first word line WL1 and belonging to the cell strings (NS11, NS12, and NS13) are programmed, the first word line WL1 and the first string selection line SSL1 may be selected. The ground selection lines (GSL1 through GSL3) may be commonly connected to each other. In addition, the memory cells (for example, MC1_1 and MC2_1) connected to the word lines (for example, WL1 and WL5) on the same level of the memory stacks (ST1 and ST2) may have substantially the same properties, respectively. This is described later with reference to FIG. 4.

Figure 4:
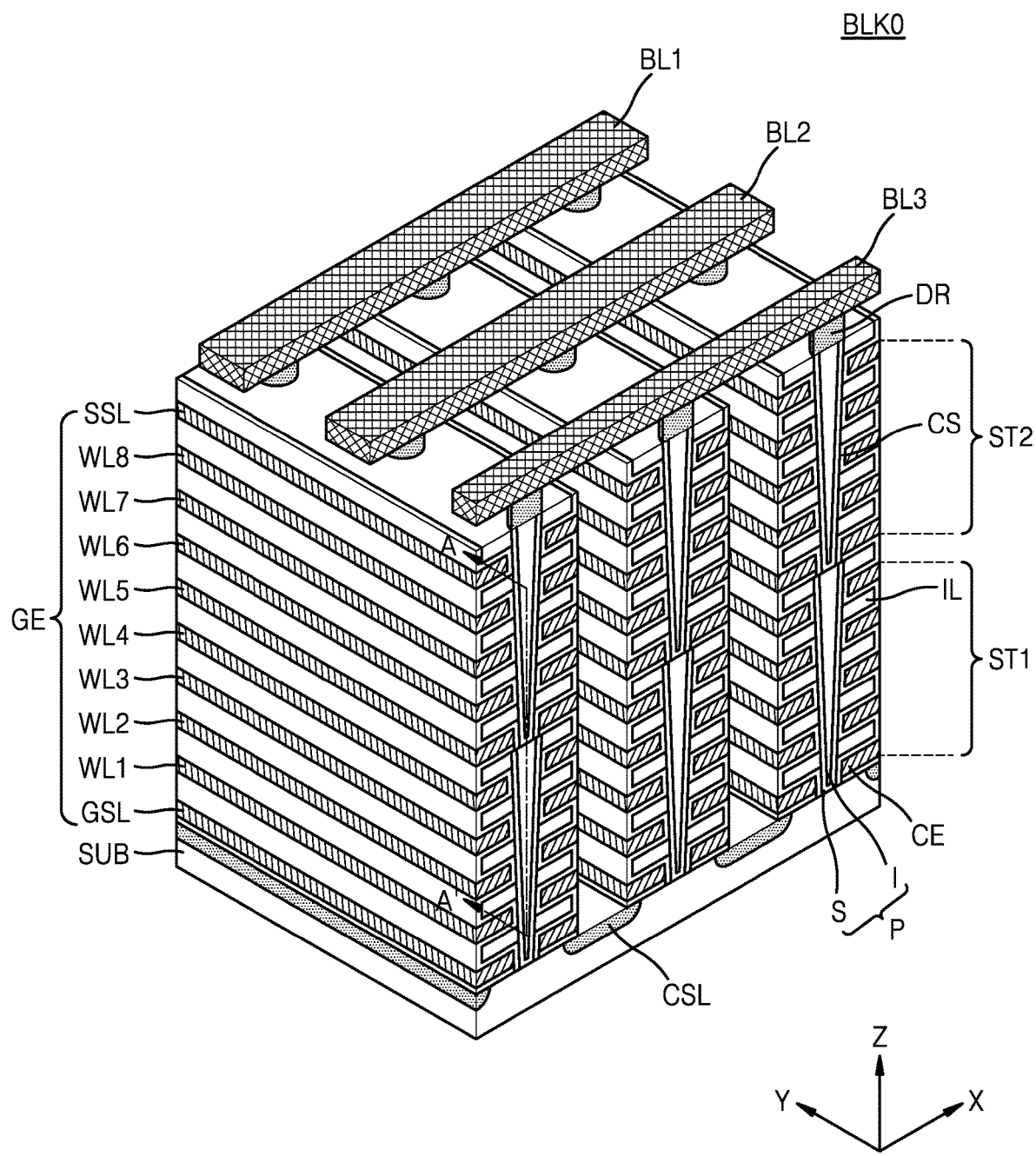
FIG. 4 is a perspective view of the memory block of FIG. 3.

FIG. 4 is a perspective view of the memory block BLK0 of FIG. 3.

Referring to FIG. 4, each memory block BLK0 included in a memory cell array (for example, 140 in FIG. 2) may be formed in a vertical direction with respect to a substrate SUB. In FIG. 4, the memory block BLK0 is illustrated as including two selection lines (GSL and SSL), eight word lines (WL1 through WL8), and three bit lines (BL1 through BL3), but the numbers thereof may actually be more or less than these numbers.

The substrate SUB may be of a first conductivity type (for example, a p-type), and the common source line CSL that extends therein in a first direction (for example, a Y-direction) and is of a second conductivity type (for example, n-type) may be provided.

The first memory stack ST1 may be provided on the substrate SUB. In a region of the substrate SUB between two adjacent common source lines CSL, a plurality of insulating layers IL, which extend in the first direction, may be sequentially provided in a third direction (for example, a Z-direction), and the plurality of insulating layers IL may be apart from each other by a certain distance in the third direction. For example, the plurality of insulating layers IL may include an insulating material such as silicon oxide. In the region of the substrate SUB between two adjacent common source lines CSL, a plurality of pillars Ps sequentially arranged in the first direction may be provided and may penetrate the plurality of insulating layers ILs in the third direction. For example, the plurality of pillars P may penetrate the plurality of insulating layers IL and contact the substrate SUB. A surface layer S of each pillar P may include a silicon material of the first type and may function as a channel region. On the other hand, an inner layer I of each pillar P may include an insulating material such as silicon oxide or an air gap.

In the region between two adjacent common source lines CSL, a charge storage layer CS may be provided along exposed surfaces of the insulating layers IL, the pillars P, and the substrate SUB. The charge storage layer CS may include a gate insulating layer (or a tunneling insulating layer), a charge trap layer, and a blocking insulating layer. For example, the charge storage layer CS may have an oxide-nitride-oxide (ONO) structure. In addition, in a region between two adjacent common source lines CSL, a gate electrode GE including the selection lines (GSL and SSL) and the word lines (WL1 through WL4) may be provided on an exposed surface of the charge storage layer CS.

The memory block BLK0 according to the technical idea of the inventive concept may additionally be provided with the second memory stack ST2 generated in the same manner on the first memory stack ST1 generated by the above method. Drains or drain contacts DR may be provided on each of the plurality of pillars P extending to the second memory stack ST2. For example, the drains or the drain contacts DR may include a silicon material doped with impurities of the second conductivity type. On the drains DR, the bit lines (BL1 through BL3) which extend in the second direction (for example, the X-axis) and are apart from each other by a certain distance in the first direction may be provided.

Figure 5:
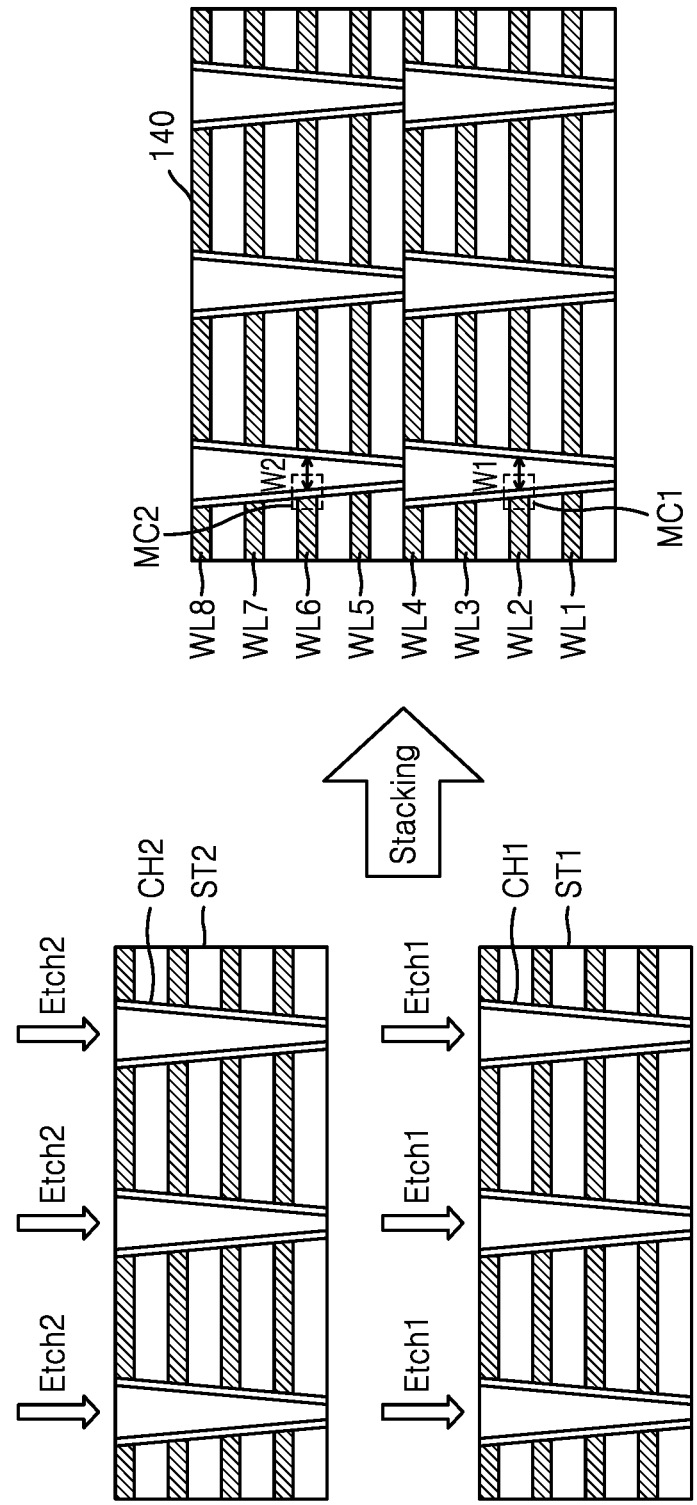
FIG. 5 is a diagram illustrating a method of generating a memory cell array, according to an embodiment.

FIG. 5 is a diagram illustrating a method of forming a memory cell array, according to an embodiment. FIG. 5 illustrates a section taken along the line A-A' in FIG. 4. Descriptions already given with reference to FIG. 4 are omitted.

Referring to FIG. 5, the first memory stack ST1 may be formed through a first etch Etch1 on a plurality of layers formed by the method described above with reference to FIG. 4. In addition, the second memory stack ST2 may be formed through a second etch Etch2 on a plurality of layers formed independently from the first memory stack ST1. The memory cell array 140 may be formed by stacking the first memory stack ST1 and the second memory stack ST2 to share channel holes with each other. In an exemplary embodiment, the first memory stack ST1 may include a first channel hole CH1 and the second memory stack ST2 may include a second channel hole CH2 connected to the first channel hole CH1. The second channel hole CH2 may have a bottom having a second width smaller than a width of a top of the first channel hole CH1. The first memory stack ST1 may include a first memory cell MC1 connected to the second word line WL2, and the second memory stack ST2 may include a second memory cell MC2 connected to the sixth word line WL6.

Since the first memory stack ST1 and the second memory stack ST2 undergo the same production process including the same etching process, widths (for example, W1 and W2) of the channel holes included in the memory cells (for example, MC1 and MC2) at the same level within the first memory stack ST1 and the second memory stack ST2 may have substantially the same profiles. For example, the first width W1 of the channel hole included in the first memory cell MC1 may be the same as or similar to the second width W2 of the channel hole included in the second memory cell MC2. Accordingly, the memory cells may have substantially the same cell characteristics such as a threshold voltage distribution, for example, and thus various operations of the first memory cell MC1 and the second memory cell MC2 may be performed using substantially the same voltages. For example, when two memory cells have substantially the same threshold voltage distribution, applied voltages for an operation such as a program operation and a read operation may be substantially the same.

A nonvolatile memory device according to the technical idea of the inventive concept may perform an operation such as a program operation and a read operation on the plurality of memory stacks (ST1 and ST2) by using substantially the same program/read characteristics of the memory cells (for example, MC1 and MC2) at the same level within the plurality of memory stacks, and thereby may increase the speed of the operation such as the program operation and the read operation. In other words, the nonvolatile memory device may determine an applied voltage to be applied to the second memory stack ST2 based on any one of a plurality of applied voltages applied for determining cell characteristics of the first memory stack ST1. For example, an operation may be performed on the first memory stack ST1 using a plurality of applied voltages until the operation is completed, and a voltage to be applied to the second memory stack ST2 may be determined based on any one of a plurality of applied voltages at which the operation performed on the first memory stack ST1 has been completed. In an embodiment, a plurality of applied voltages applied to the memory cells to determine cell characteristics may be a plurality of first program voltages for incremental step pulse programming (ISPP), and the nonvolatile memory device may apply to the second memory stack ST2 any one of the plurality of first program voltages applied to the first memory stack ST1. In an embodiment, the plurality of applied voltages applied to the memory cells to determine cell characteristics may be a plurality of first read voltages for a read retry operation, and the nonvolatile memory device may perform the read retry operation by applying to the second memory stack ST2 any one of the plurality of first read voltages applied to the first memory stack ST1.

Figures 6, 7:
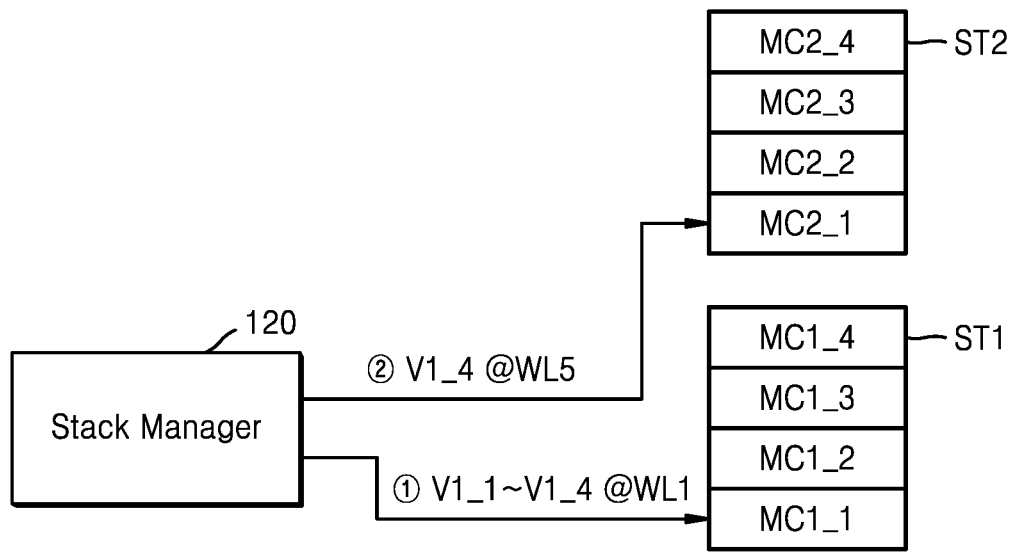
FIG. 6 is a diagram illustrating an operation of a nonvolatile memory device, according to an embodiment.
FIG. 7 is a table showing applied voltages for word lines of a stack manager according to an embodiment.

FIG. 6 is a diagram illustrating an operation of the nonvolatile memory device 10 according to an embodiment.

Referring to FIG. 6, the nonvolatile memory device 10 may include the stack manager 120, the first memory stack ST1, and the second memory stack ST2. The first memory stack ST1 may include the plurality of first memory cells (MC1_1 through MC1_4), and the second memory stack ST2 may include the plurality of second memory cells (MC2_1 through MC2_4). In addition, the plurality of first memory cells (MC1_1 through MC1_4) may be sequentially connected to the first through fourth word lines WL1 through WL4, and the plurality of second memory cells (MC2_1 through MC2_4) may be sequentially connected to the fifth through eighth word lines WL5 through WL8.

The stack manager 120 may apply a plurality of first applied voltages (V1_1 through V1_4) to the first word line WL1 for an operation such as a program operation and a read retry operation. In an embodiment, when the plurality of first applied voltages (V1_1 through V1_4) are program voltages for a programming operation, the stack manager 120 may program the first memory cell MC1_1 connected to the first word line WL1 by sequentially applying the plurality of first applied voltages (V1_1 through V1_4). For example, the program operation may be performed using an incremental step pulse programming (ISPP) scheme, where the first applied voltage V1_1 is a start bias voltage for the ISPP scheme and the first applied voltage V1_4 is an end bias voltage for the ISPP scheme. The programing operation performed on a memory cell is completed at the application of the end bias voltage. In an embodiment, when the plurality of first applied voltages (V1_1 through V1_4) are the read voltages that have been changed according to an error correction failure, the stack manager 120 may read data from the first memory cell MC1_1 connected to the first word line WL1 by sequentially applying the plurality of first applied voltages (V1_1 through V1_4). For example, when a read operation performed on the first memory cell MC1_1 of the first memory stack ST1 is unsuccessful (i.e., an error correction of read data fails), a read retry operation may be performed on the first memory cell MC1_1 to set a new read voltage by applying the plurality of first applied voltages (V1_1 through V1_4) thereto. For example, the stack manager 120 may read data from the first memory cell MC1_1 connected to the first word line WL1 by sequentially applying the plurality of first applied voltages (V1_1 through V1_4) to set the new read voltage. The first applied voltage V1_1 is a start read retry voltage and the first applied voltage V1_4 is an end read retry voltage (i.e., the new read voltage) at which the read retry operation has been completed.

The stack manager 120 may apply to the fifth word line WL5 any one voltage (for example, V1_4) of the plurality of first applied voltages (V1_1 through V1_4) applied to the first word line WL1. In an embodiment in which the plurality of first applied voltages (V1_1 through V1_4) are the program voltages, the stack manager 120 may program the second memory cell MC2_1 connected to the fifth word line WL5 by applying to the fifth word line WL5 any one voltage, (for example, V1_4) of the plurality of first applied voltages (V1_1 through V1_4) applied to the word line WL1 as a start bias voltage of the ISPP scheme for the second stack ST2. For example, the stack manager 120 may program the second memory cell MC2_1 connected to the fifth word line WL5 by applying the end program voltage V1_4 to the fifth word line WL5 as a start bias voltage of the ISPP scheme for the second memory cell MC2_1 of the second stack ST2.

In an embodiment in which the plurality of first applied voltages (V1_1 through V1_4) are a plurality of read retry voltages, when an error correction fails for the data read from the second memory cell MC2_1 connected to the fifth word line WL5, the stack manager 120 may read the data from the second memory cell MC2_1 connected to the fifth word line WL5 by applying to the fifth word line WL5 any one read retry voltage (for example, V1_4) of the plurality of first applied voltages (V1_1 through V1_4) as a read voltage for the read operation performed on the fifth word line WL5. For example, the stack manager 120 may perform a read operation on the second memory cell MC2_1 connected to the fifth word line WL5 by applying the end read retry voltage V1_4 to the fifth word line WL5 as a read voltage for the read operation performed on the second memory cell MC2_1 of the second stack ST2. Accordingly, another read retry operation for the second stack ST2 may be avoided.

The stack manager 120 according to certain aspects of the inventive concept may perform the program operation or the read retry operation for the first memory cell MC1_1 by using the plurality of first applied voltages (V1_1 through V1_4) for the first memory stack ST1, and by using any one voltage (for example, V1_4) of the plurality of first applied voltages (V1_1 through V1_4) for the program operation or the read operation of the second memory cell MC2_1 of the second memory stack ST2 at the same level as the first memory cell MC1_1, a duplicate application of applied voltages may be avoided. As a result, performance of the program operation or the read operation may be improved.

In FIG. 6, an example is illustrated in which a voltage applied to the second memory cell MC2_1 connected to the fifth word line WL5 by using applied voltage information for the first memory cell MC1_1 connected to the first word line WL1 is described. However, the method of controlling the applied voltage of the second memory cell MC2_1 connected to the fifth word line WL5 may also be applied to the remaining second memory cells (MC2_2 through MC2_4) of the second stack ST2.

In the example of FIG. 6, the plurality of first applied voltages (V1_1 through V1_4) are illustrated to include four voltages. For example, for a programing operation, the first applied voltages V1_1 through V1_4 may be sequentially applied from the first applied voltage V1_1 to the first applied voltage V1_4 in the ISPP scheme. The first applied voltage V1_1 may be referred to as a start bias voltage and the first applied voltage V1_4 may be referred to as an end bias voltage. At the application of the end bias voltage, the ISSP scheme of the program operation may be completed. For a retry read operation, the first applied voltages V1_1 through V1_4 may be sequentially applied from the first applied voltage V1_1 to the first applied voltage V1_4. The first applied voltage V1_1 may be referred to as a start read retry voltage and the first applied voltage V1_4 may be referred to as an end read retry voltage. The end read retry voltage may be a new read voltage for a read operation. The end bias voltage and the end read retry voltage may be also referred to as a determined voltage. The above embodiment is only an example. The first applied voltages (V1_1 through V1_4) may include more than or less than four voltages.

In addition, in FIG. 6, an example is illustrated in which the nonvolatile memory device 10 includes two memory stacks (ST1 and ST2) and each of the memory stacks (ST1 and ST2) includes four memory cells, but the embodiment is only an example. Even when the nonvolatile memory device 10 includes more than two memory stacks and each of the memory stacks ST1 and ST2 includes more than or less than four memory cells, the technical idea of the inventive concept may be applicable.

FIG. 7 is a table showing applied voltages for the word lines (WL1 through WL8) of the stack manager 120 according to an embodiment. Descriptions already given with reference to FIG. 6 are omitted.

Referring to FIGS. 6 and 7, the stack manager 120 may store applied voltages in an applied voltage table AVT as illustrated in FIG. 7 and may apply voltages to the word lines (WL1 through WL8) based on the applied voltage table AVT.

The stack manager 120 may apply a plurality of first applied voltages (V1_1 through V1_4) to the first word line WL1 and determine any one applied voltage (for example, V1_4) of the first applied voltages (V1_1 through V1_4) for an operation such as a programing operation and a read retry operation. The stack manager 120 may update the determined applied voltage (for example, V1_4) in the applied voltage table AVT. Next, the stack manager 120 may perform a program operation or a read operation on the second memory cell MC2_1 connected to the fifth word line WL5 by applying the determined voltage (for example, V1_4) to the fifth word line WL5 at the same level as the first word line WL1. For example, for a program operation, the determined voltage (V1_4) for the first memory stack ST1 may serve as a start bias voltage for the ISPP scheme performed on the fifth word line WL5 of the second stack ST2. For a read operation, the determined voltage (V1_4) for the first memory stack ST1 may serve as a read voltage applied to the fifth word line WL5 of the second memory stack ST2.

The stack manager 120 may apply a plurality of second applied voltages (V2_1 through V2_4) to the second word line WL2 and determine any one voltage (for example, V2_4) of the second applied voltages (V2_1 through V2_4). The stack manager 120 may update the determined voltage (for example, V2_4) in the applied voltage table AVT. Next, the stack manager 120 may perform a program operation or a read operation on the second memory cell MC2_2 connected to the sixth word line WL6 by applying the determined voltage (for example, V2_4) to the sixth word line WL6 at the same level as the second word line WL2.

The stack manager 120 may apply a plurality of third applied voltages (V3_1 through V3_4) to the third word line WL3 and determine any one voltage (for example, V3_4) of the third applied voltages (V3_1 through V3_4). The stack manager 120 may update the determined voltage (for example, V3_4) in the applied voltage table AVT. Next, the stack manager 120 may perform a program operation or a read operation on the second memory cell MC2_3 connected to the seventh word line WL7 by applying the determined voltage (for example, V3_4) to the seventh word line WL7 at the same level as the third word line WL3.

The stack manager 120 may apply a plurality of applied voltages (V4_1 through V4_4) to the fourth word line WL4 and determine any one voltage (for example, V4_4) of the fourth applied voltages (V4_1 through V4_4). The stack manager 120 may update the determined voltage (for example, V4_4) in the applied voltage table AVT. Next, the stack manager 120 may perform the program operation or the read operation on the second memory cell MC2_4 connected to the eighth word line WL8 by applying the determined voltage (V4_4) to the eighth word line WL8 at the same level as the fourth word line WL4.

Figure 8:
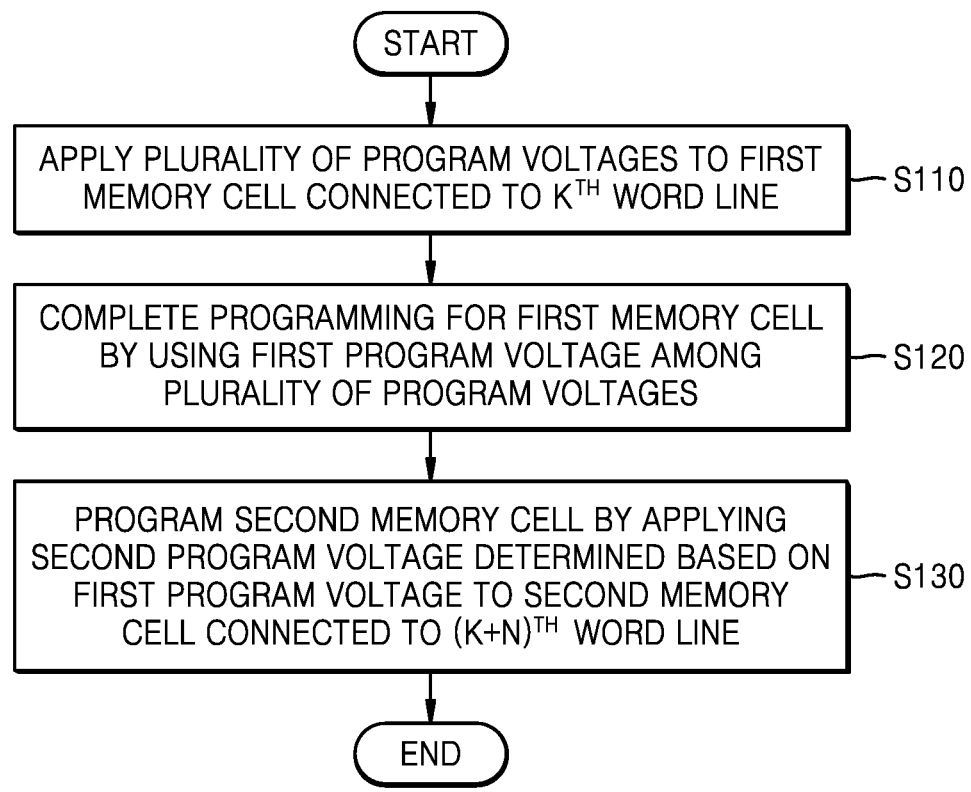
FIG. 8 is a flowchart illustrating an operation of a nonvolatile memory device, according to an embodiment.

FIG. 8 is a flowchart illustrating an operation of the nonvolatile memory device 10 according to an embodiment. FIG. 8 describes a programming method of the nonvolatile memory device 10.

Referring to FIGS. 2 and 8, the first memory stack ST1 may be sequentially connected to the first through $N^{th}$ word lines (e.g., N is an integer of 1 or greater), and the second memory stack ST2 may be sequentially connected to the $(N+1)^{th}$ through the $M^{th}$ word lines (e.g., M is an integer greater than N).

The stack manager 120 may apply the plurality of program voltages to the first memory cell connected to a $k^{th}$ word line (S110). For example, k is an integer between 1 and N inclusive. The stack manager 120 may complete a program operation performed on the first memory cell of the first memory stack ST1 by using a first program voltage among the plurality of program voltages (S120). For example, the first program voltage may correspond to the end bias voltage or the determined voltage of the ISPP scheme for the program operation. The stack manager 120 may program the second memory cell MC2 of the second memory stack ST2 by applying the first program voltage to the second memory cell connected to a $(k+N)^{th}$ word line at the same level as the $k^{th}$ word line (S130). For example, the first program voltage may serve as a start bias voltage of an ISPP scheme of a program operation performed on the second memory cell MC2 of the second memory stack ST2.

Figure 9:
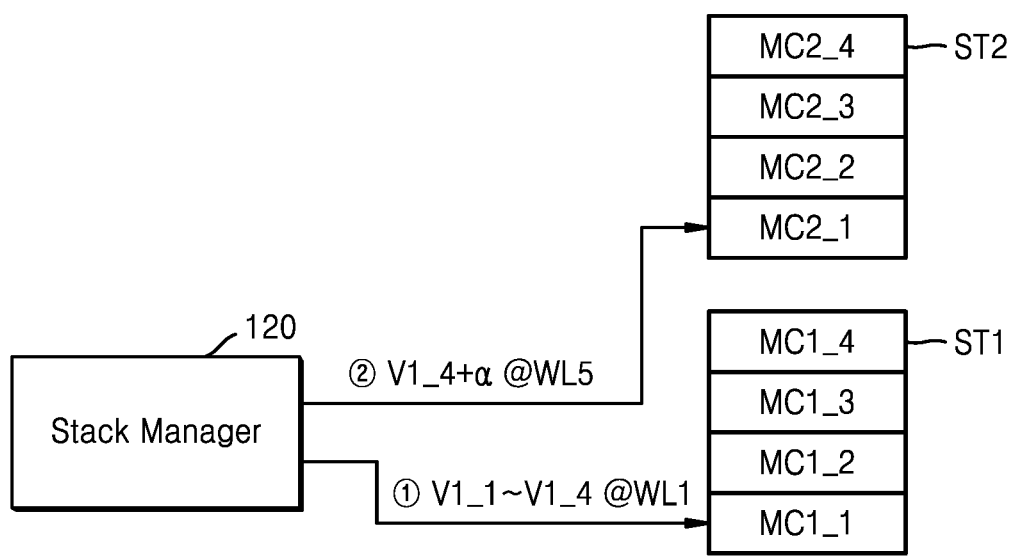
FIG. 9 is a diagram illustrating an operation of a nonvolatile memory device, according to an embodiment.

FIG. 9 is a diagram illustrating an operation of the nonvolatile memory device 10 according to an embodiment. Descriptions already given with reference to FIG. 6 are omitted.

Referring to FIG. 9, the nonvolatile memory device 10 may include the stack manager 120, the first memory stack ST1, and the second memory stack ST2. The stack manager 120 may apply the plurality of first applied voltages (V1_1 through V1_4) to the first word line WL1. The stack manager 120 may apply to the fifth word line WL5 a second applied voltage that is a sum of an offset α and any one voltage (for example, V1_4) among the plurality of first applied voltages (V1_ through V1_4) applied to the first word line WL1.

In an embodiment, the stack manager 120 may determine the offset α by applying a plurality of voltages to each of the first memory stack ST1 and the second memory stack ST2. This is described later with reference to FIG. 11. For example, when the memory cells of the second memory stack ST2 have cell characteristics such as a threshold voltage distribution that is shifted by the offset α from cell characteristics of the memory cells of the first memory stack ST1, the offset α may be added to the determined voltage (e.g., V1_4) of an operation performed on the first memory stack ST1. The sum of the offset α and the determined voltage may be applied to the second memory stack ST2.

In an embodiment, the stack manager 120 may determine any one voltage (for example, V1_4) among the plurality of first applied voltages (V1_1 through V1_4) applied to the first word line WL1 and update a second applied voltage, which is a sum of the determined voltage (for example, V1_4) and the offset α, in an applied voltage table (for example, the AVT in FIG. 7).

In FIG. 9, an example is illustrated in which a voltage applied to the second memory cell MC2_1 connected to the fifth word line WL5 by using applied voltage information for the first memory cell MC1_1 connected to the first word line WL1 is described. However, the method of controlling the applied voltage of the second memory cell MC2_1 connected to the fifth word line WL5 may be applicable to the remaining second memory cells (MC2_2 through MC2_4).

Figure 10:
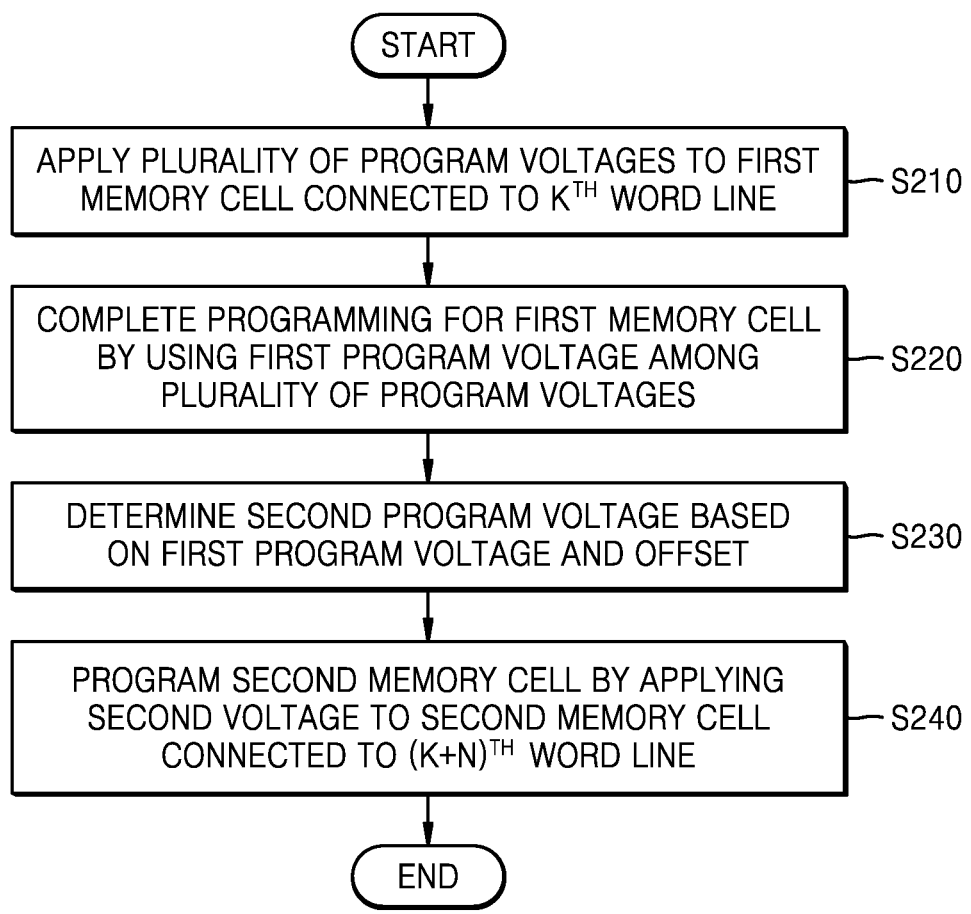
FIG. 10 is a flowchart illustrating an operation of a nonvolatile memory device, according to an embodiment.

FIG. 10 is a flowchart illustrating an operation of the nonvolatile memory device 10 according to an embodiment. FIG. 10 shows a programming method of the nonvolatile memory device 10.

Referring to FIGS. 2 and 10, the first memory stack ST1 may be sequentially connected to the first through $N^{th}$ word lines, and the second memory stack ST2 may be sequentially connected to the $(N+1)^{th}$ through $M^{th}$ word lines. N is an integer of one or greater, and M is an integer greater than N.

The stack manager 120 may apply the plurality of program voltages to the first memory cell connected to the $k^{th}$ word line (S210). k is an integer between 1 and N inclusive. The stack manager 120 may complete the program for the first memory cell by using the first program voltage among the plurality of program voltages (S220). The stack manager 120 may determine the second program voltage based on the first program voltage and the offset (S230). The stack manager 120 may program the second memory cell by applying the second program voltage to the second memory cell connected to the $(k+N)^{th}$ word line at the same level as the $k^{th}$ word line (S240).

Figure 11:
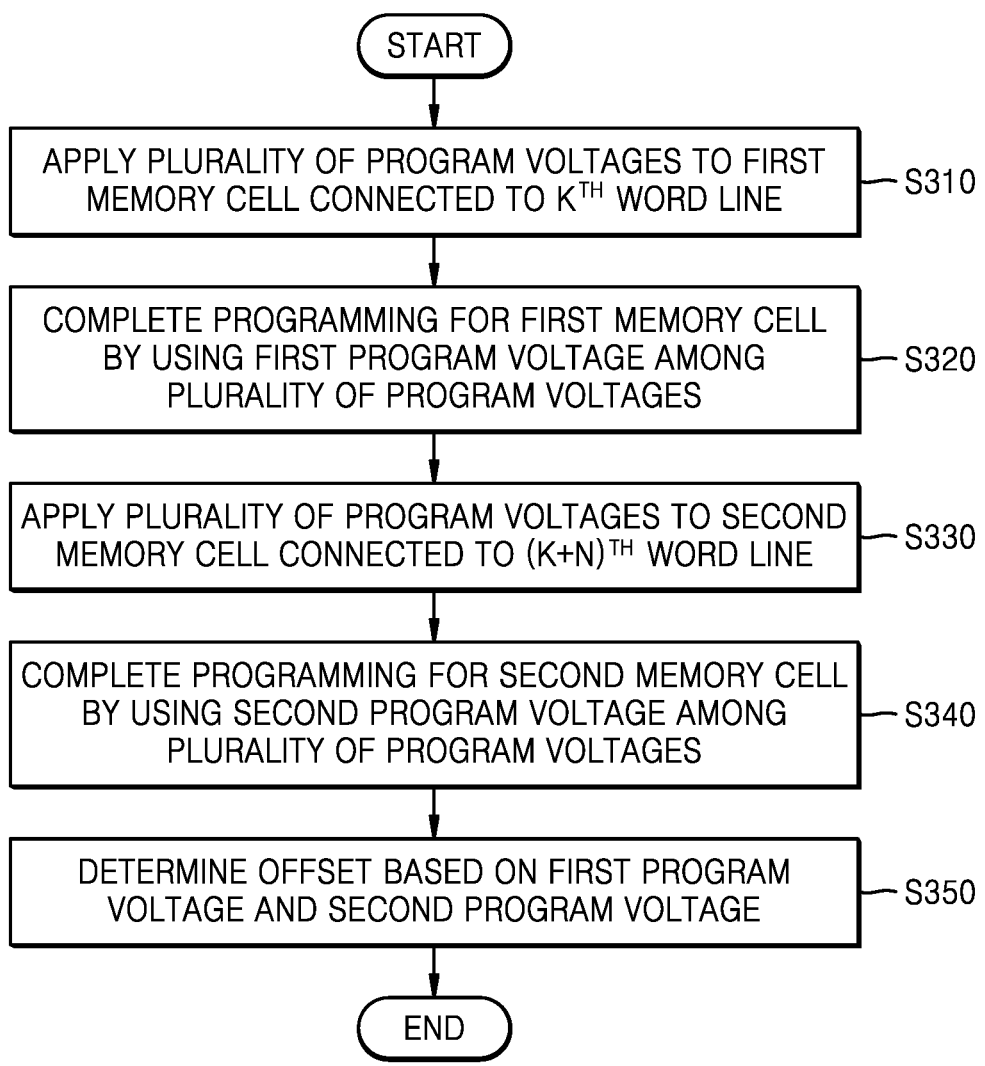
FIG. 11 is a flowchart illustrating an operation of a nonvolatile memory device, according to an embodiment.

FIG. 11 is a flowchart illustrating an operation of the nonvolatile memory device 10 according to an embodiment. FIG. 11 shows a method of determining the offset of the nonvolatile memory device 10.

Referring to FIGS. 2 and 11, the first memory stack ST1 may be sequentially connected to the first through $N^{th}$ word lines, and the second memory stack ST2 may be sequentially connected to the $(N+1)^{th}$ through the $M^{th}$ word lines. N is an integer of 1 or greater, and M is an integer greater than N.

The stack manager 120 may apply the plurality of program voltages to the first memory cell connected to the $k^{th}$ word line (S310). The stack manager 120 may complete the program for the first memory cell by using the first program voltage among the plurality of program voltages (S320).

The stack manager 120 may apply to the second memory stack ST2 the plurality of program voltages to the second memory cell connected to the $(K+N)^{th}$ word line at the same level as the $k^{th}$ word line (S330). The stack manager 120 may complete the program for the second memory cell by using the second program voltage among the plurality of program voltages (S340).

The stack manager 120 may determine the offset based on the first program voltage and the second program voltage. In an embodiment, the stack manager 120 may determine a difference between the first program voltage and the second program voltage as the offset (S350). The first program voltage and the second program voltage may be referred to as a first test program voltage and a second test program voltage, respectively.

FIG. 11 illustrates a method of determining the offset used in the program operation. However, similar to the above-described method, the stack manager 120 may determine the offset used in the read operation by applying a plurality of read voltages to a word line at the same level in the plurality of memory stacks.

Figure 12:
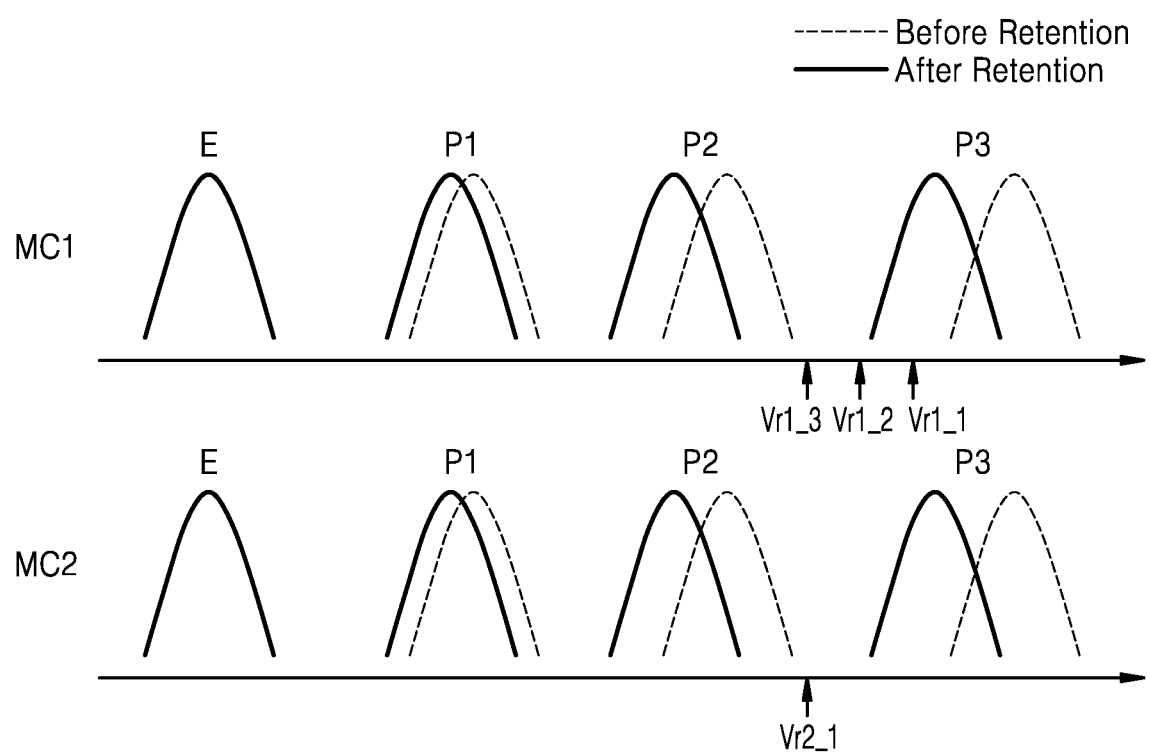
FIG. 12 is a graph illustrating a cell distribution of a memory cell according to an embodiment.

FIG. 12 is a graph illustrating a cell threshold voltage distribution of a memory cell according to an embodiment. FIG. 12 illustrates the read operation of the nonvolatile memory device 10.

Referring to FIGS. 2 and 12, the nonvolatile memory device 10 may program the first memory cell MC1 included in the first memory stack ST1 and the second memory cell MC2 included in the second memory stack ST2 to one of an erase state E and three programed states P1 to P3. A retention phenomenon may occur in the first memory cell MC1 and the second memory cell MC2 over time, and the cell distribution may be changed from dashed lines to solid lines. Accordingly, the nonvolatile memory device 10 may fail in the error correction in the read process for the first memory cell MC1 and the second memory cell MC2, and then, after a level of the read voltage is changed, may perform the read retry operation in which the read operation is performed again.

For the read retry operation, the stack manager 120 may apply a plurality of first read retry voltages (Vr1_1 through Vr1_3) to the first memory cell MC1 and may succeed in the read operation by using the first read retry voltage (for example, Vr1_3) among the plurality of first read retry voltages (Vr1_1 through Vr1_3). For example, the first read retry voltage (for example, Vr1_3) may be referred to as the end read retry voltage or the determined voltage of the read retry operation. In the present specification, an operation in which the plurality of first read retry voltages (Vr1_1 through Vr1_3) are applied for the read retry operation and the read operation is performed by using the first read retry voltage (for example, Vr1_3) may be referred to as a valley searching algorithm.

The stack manager 120 may determine the second read voltage Vr2_1 based on the first read retry voltage Vr1_3 determined for the second memory cell MC2 of the second memory stack ST2 at the same level as the first memory cell MC1 and may read the second memory cell MC2 by using the determined second read voltage Vr2_1. For example, the first read retry voltage Vr1_3 may serve as a read voltage for a read operation performed on the second memory cell MC2.

According to an embodiment, by performing the read operation on the second memory cell MC2 included in the second memory stack ST2 based on the first read voltage (for example, Vr1_3) that is determined as a result of the read retry operation for the first memory cell MC1 included in the first memory stack ST1, the number of applied voltages may be reduced, and a read performance may be improved.

Figure 13:
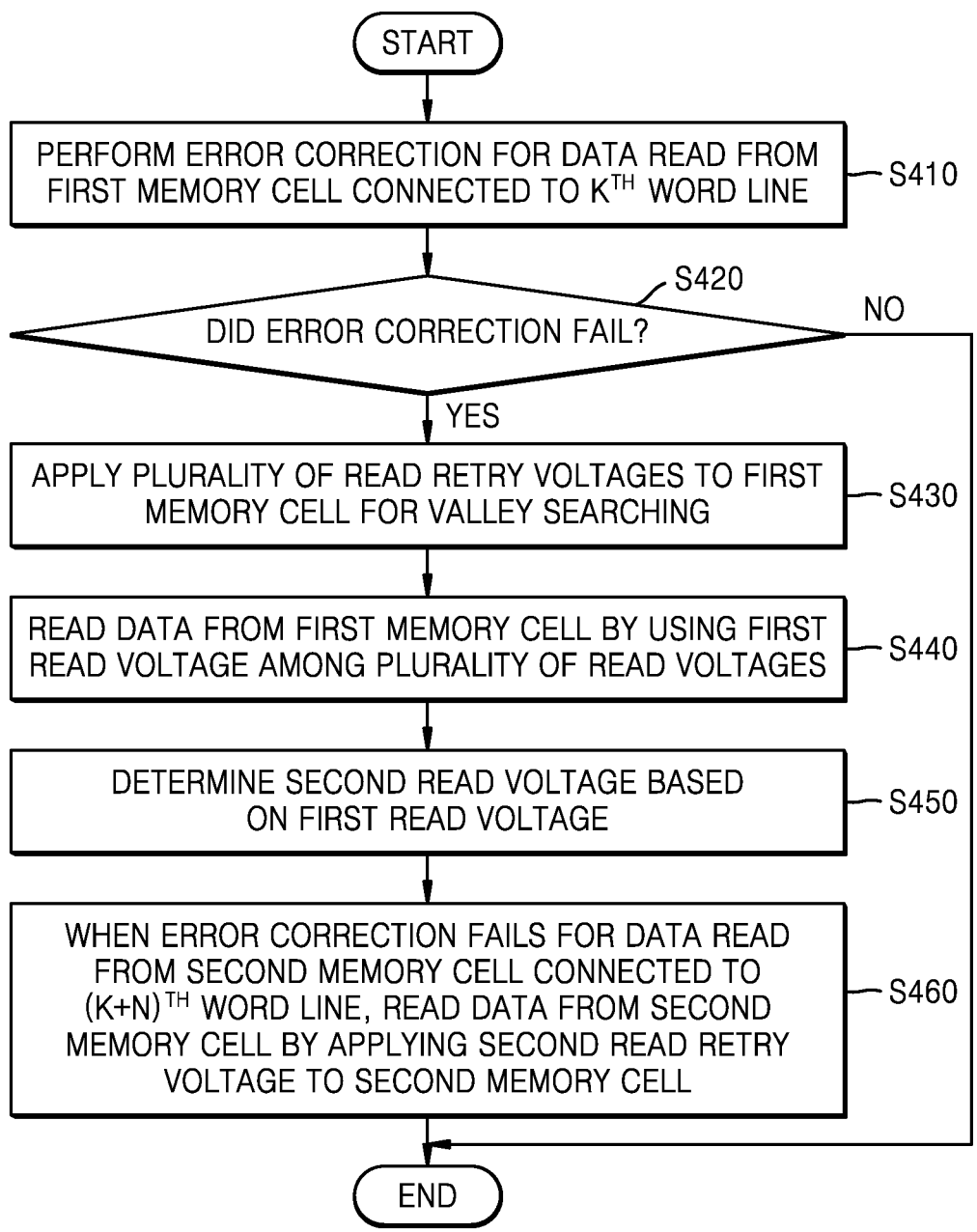
FIG. 13 is a flowchart illustrating an operation of a nonvolatile memory device, according to an embodiment.

FIG. 13 is a flowchart illustrating an operation of the nonvolatile memory device 10, according to an embodiment. FIG. 13 illustrates the read method of the nonvolatile memory device 10.

Referring to FIGS. 2 and 13, the first memory stack ST1 may be sequentially connected to the first through $N^{th}$ word lines, and the second memory stack ST2 may be sequentially connected to the $(N+1)^{th}$ through the $M^{th}$ word lines. N is an integer of 1 or greater, and M is greater than N.

The stack manager 120 may perform an error correction operation on data read from the first memory cell connected to the $k^{th}$ word line (S410 and S420). "k" is an integer between 1 and N inclusive. When the error correction operation is successful, data related with the succeeded error correction may be output. When the error correction operation fails, for the valley searching, the stack manager 120 may apply the plurality of read retry voltages to the first memory cell (S430). The stack manager 120 may succeed in reading data from the first memory cell by using a first read voltage among the plurality of read retry voltages (S440).

The stack manager 120 may determine a second read voltage based on the first read voltage (S450). In an embodiment, the stack manager 120 may determine the voltage level of the second read voltage to be identical to the voltage level of the first read voltage. In an embodiment, the stack manager 120 may determine the voltage level of the second read voltage based on the first read voltage and the offset determined through the method described with reference to FIG. 11.

When the error correction for data read from the second memory cell connected to the $(k+N)^{th}$ word line at the same level as the $k^{th}$ word line fails, the stack manager 120 may read data from the memory cell by applying the second read voltage to the second memory cell (S460).

Figure 14:
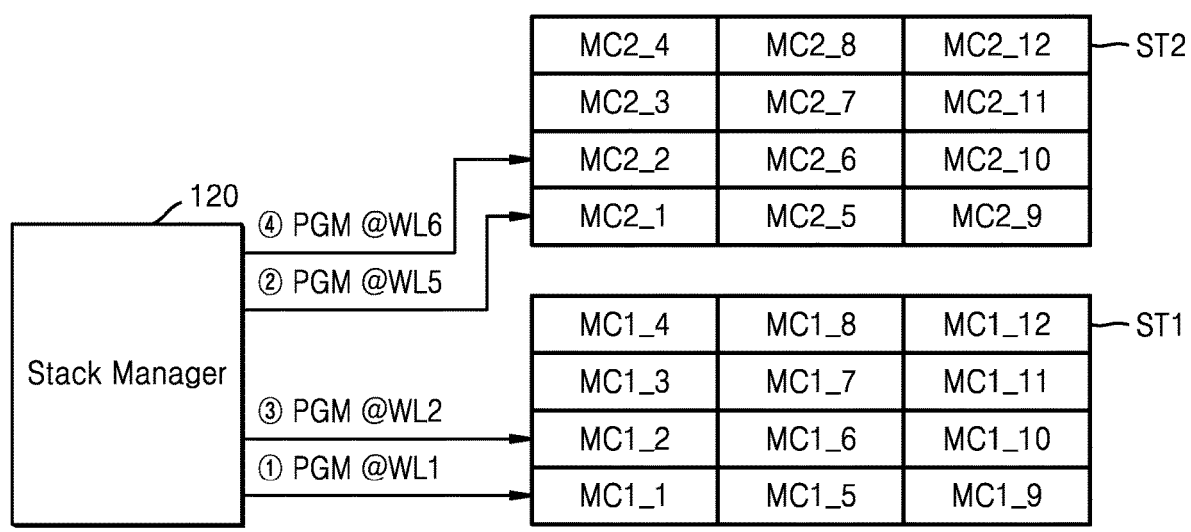
FIG. 14 is a diagram illustrating an operation of a nonvolatile memory device, according to an embodiment.

FIG. 14 is a diagram illustrating an operation of the nonvolatile memory device 10 according to an embodiment.

Referring to FIG. 14, the nonvolatile memory device 10 may include the stack manager 120, the first memory stack ST1, and the second memory stack ST2. The first memory stack ST1 may include a plurality of first memory cells (MC1_1 through MC1_12), and the second memory stack ST2 may include a plurality of second memory cells (MC2_1 through MC2_12).

The stack manager 120 may sequentially program the first memory cells (MC1_1, MC1_5, and MC1_9) connected to the first word line WL1. After the program for the first memory cells (MC1_1, MC1_5, and MC1_9) connected to the first word line WL1 is completed, the stack manager 120 may sequentially program the second memory cells (MC2_1, MC2_5, and MC2_9) connected to the fifth word line WL5.

The stack manager 120 may sequentially program the first memory cells (MC1_2, MC1_6, and MC1_10) connected to the second word line WL2. After the program for the second memory cells (MC1_2, MC1_6, and MC1_10) connected to the second word line WL2 is completed, the stack manager 120 may sequentially program the second memory cells (MC2_2, MC2_6, and MC2_10) connected to the sixth word line WL6.

As described above, since channel hole profiles for the first and second memory stacks ST1 and ST2 are substantially the same, the memory cells (for example, MC1_1, MC1_5, MC1_9, MC2_1, MC2_5, and MC2_9) at the same levels within the first and second memory stacks ST1 and ST2 may have substantially the same cell characteristic such as a cell threshold voltage distribution and thus the levels of the program voltages required for the program operation may be substantially the same. For example, the memory cells MC1_1 and MC2_1 are at the same level within the first and second memory stacks ST1 and ST2, respectively, and thus the levels of the program voltages may be substantially the same. The stack manager 120 according to an embodiment may sequentially program the memory cells at the same level within the plurality of memory stacks (ST1 and ST2), and accordingly, by changing only the address, without changing the voltage level, a plurality of memory cells may be programmed.

Figure 15:
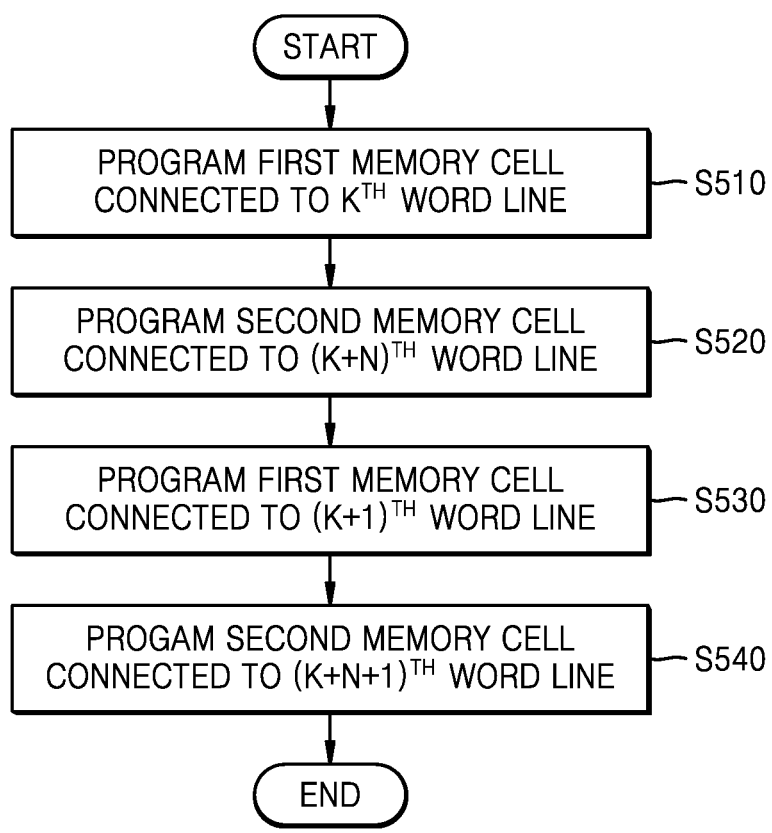
FIG. 15 is a flowchart illustrating an operation of a nonvolatile memory device, according to an embodiment.

FIG. 15 is a flowchart illustrating an operation of the nonvolatile memory device 10 according to an embodiment. FIG. 15 illustrates a program method of the nonvolatile memory device 10.

Referring to FIGS. 2 and 15, the first memory stack ST1 may be sequentially connected to the first through $N^{th}$ word lines, and the second memory stack ST2 may be sequentially connected to the $(N+1)^{th}$ through $M^{th}$ word lines. N is an integer of one or greater, and M is an integer greater than N.

The stack manager 120 may program the first memory cells connected to the $k^{th}$ word line (S510). "k" is an integer between one and N inclusive. After the program for the first memory cells connected to the $k^{th}$ word line is completed, the stack manager 120 may sequentially program the second memory cells connected to the $(k+N)^{th}$ word line (S520). The first memory cells connected to the $k^{th}$ word line and the second memory cells connected to the $(k+N)^{th}$ word line may be positioned at the same level within the first and second memory stacks ST1 and ST2, respectively.

When the program for the second memory cells connected to the $(k+N)^{th}$ word line is completed, the stack manager 120 may sequentially program the first memory cells connected to the $(k+1)^{th}$ word line (S530). After the program for the first memory cells connected to the $(k+1)^{th}$ word line is completed, the stack manager 120 may sequentially program the second memory cells connected to the $(k+N+1)^{th}$ word line of the second memory stack ST2 at the same level as the $(k+1)^{th}$ word line (S540). The first memory cells connected to the $(k+1)^{th}$ word line and the second memory cells connected to the $(k+1+N)^{th}$ word line may be positioned at the same level within the first and second memory stacks ST1 and ST2, respectively.

Figure 16:
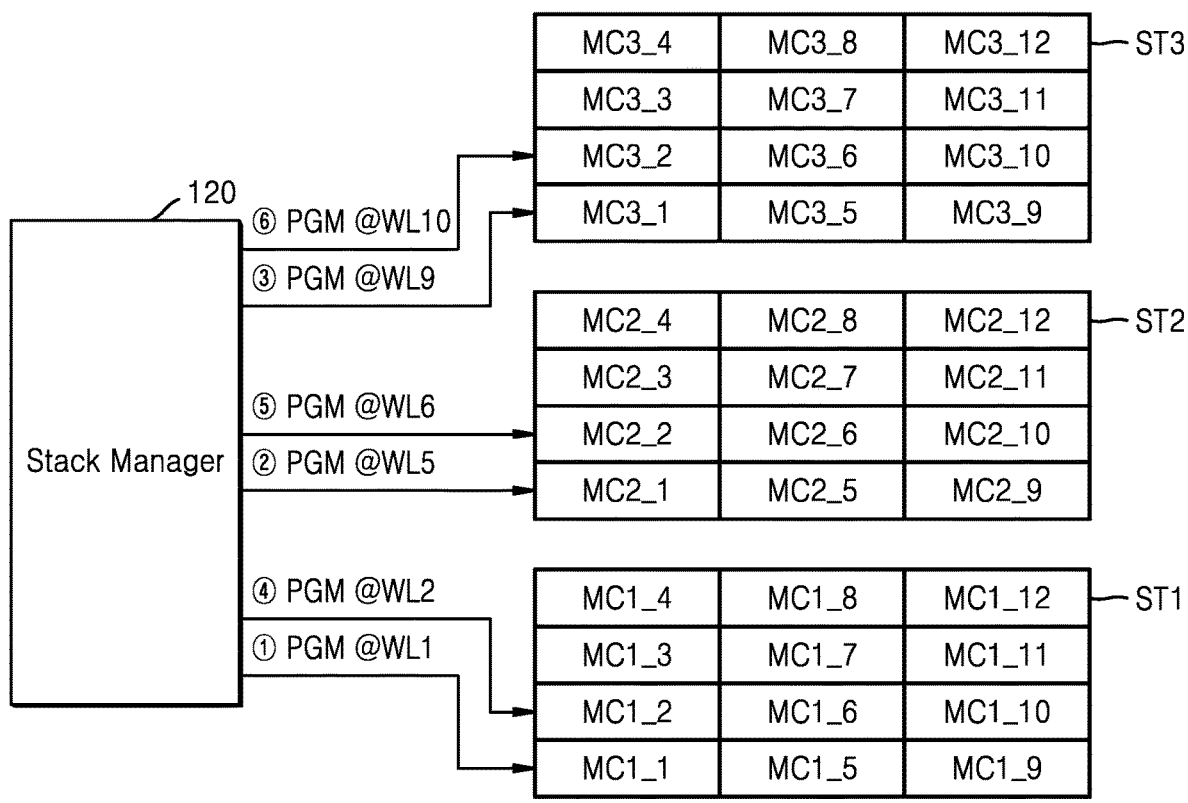
FIG. 16 is a diagram illustrating an operation of a nonvolatile memory device according to an embodiment.

FIG. 16 is a diagram illustrating an operation of the nonvolatile memory device 10, according to an embodiment. FIG. 16 illustrates program operations of the nonvolatile memory device 10 including three memory stacks (ST1 through ST3). Descriptions already given with reference to FIG. 14 are omitted.

Referring to FIG. 16, the nonvolatile memory device 10 may include the stack manager 120, the first memory stack ST1, the second memory stack ST2, and a third memory stack ST3, and the first through third memory stacks ST1 through ST3 may constitute a memory cell array (refer to 140 in FIG. 2) through being sequentially stacked on each other. The first memory stack ST1 may include the plurality of first memory cells (MC1_1 through MC1_12), the second memory stack ST2 may include the plurality of second memory cells (MC2_1 through MC2_12), and the third memory stack ST3 may include a plurality of third memory cells (MC3_1 through MC3_12).

The stack manager 120 may sequentially program the first memory cells (MC1_1, MC1_5, and MC1_9) connected to the first word line WL1 and the second memory cells (MC2_1, MC2_5, and MC2_9) connected to the fifth word line WL5. Next, the stack manager 120 may sequentially program the third memory cells (MC3_1, MC3_5, and MC3_9) connected to the ninth word line WL9. The first memory cells (MC1_1, MC1_5 and MC1_9), the second memory cells (MC2_1, MC2_5 and MC2_9) and the third memory cells (MC3_1, MC3_5 and MC3_9) may be positioned at the same level within the first, second and third memory stacks ST1, ST2 and ST3, respectively.

The stack manager 120 may sequentially program the first memory cells (MC1_2, MC1_6, and MC1_10) connected to the second word line WL2 and the second memory cells (MC2_2, MC2_6, and MC2_10) connected to the sixth word line WL6. Next, the stack manager 120 may sequentially program the third memory cells (MC3_2, MC3_6, and MC3_10) connected to the tenth word line WL10. The first memory cells (MC1_2, MC1_6 and MC1_10), the second memory cells (MC2_2, MC2_6 and MC2_10) and the third memory cells (MC3_2, MC3_6 and MC3_10) may be positioned at the same level within the first, second and third memory stacks ST1, ST2 and ST3, respectively.

Even though FIG. 16 illustrates an embodiment in which the nonvolatile memory device 10 includes three memory stacks (ST1, ST2, and ST3), the technical idea of the inventive concept is applicable to embodiments in which the nonvolatile memory device 10 includes more than three memory stacks.

Figure 17:
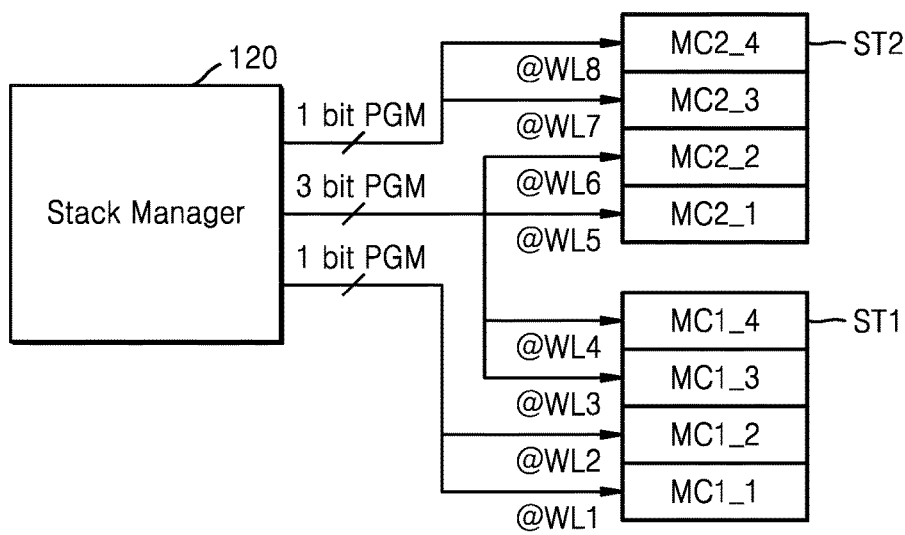
FIG. 17 is a diagram illustrating an operation of a nonvolatile memory device according to an embodiment.

FIG. 17 is a diagram illustrating an operation of the nonvolatile memory device 10, according to an embodiment. FIG. 17 is a diagram illustrating a program method of the nonvolatile memory device 10.

Referring to FIG. 17, the nonvolatile memory device 10 may include the stack manager 120, the first memory stack ST1, and the second memory stack ST2. The first memory stack ST1 may include the plurality of first memory cells (MC1_1 through MC1_4), and the second memory stack ST2 may include the plurality of second memory cells (MC2_1 through MC2_4).

The stack manager 120 may program the first memory cells (MC1_1 and MC1_2) connected to the first word line WL1 and the second word line WL2 in a first bit program mode. In an example in which the first bit program mode programs 1 bit per a memory cell, the stack manager 120 may program the first memory cells (MC1_1 and MC1_2) connected to the first word line WL1 and the second word line WL2 as single level cells (SLCs).

The stack manager 120 may program the first memory cells (MC1_3 and MC1_4) connected to the third word line WL3 and the fourth word line WL4, and the second memory cells (MC2_1 and MC2_2) connected to the fifth word line WL5 and the sixth word line WL6 in a second bit program mode. In an example in which the second bit program mode programs 3 bits per a memory cell, the stack manager 120 may program first memory cells (MC1_3 and MC1_4) connected to the third word line WL3 and the fourth word line WL4, and the second memory cells (MC2_1 and MC2_2) connected to the fifth word line WL5 and the sixth word line WL6 as triple level cells (TLCs).

The stack manager 120 may program the second memory cells (MC2_3 and MC2_4) connected to the seventh word line WL7 and the eighth word line WL8 in a third bit program mode. In an example in which the third bit program mode performs 1 bit per a memory cell, the stack manager 120 may program the second memory cells (MC2_3 and MC2_4) connected to the seventh word line WL7 and the eighth word line WL8 as SLCs.

According to an embodiment, the second bit program mode may program more bits per a memory cell than the first bit and the third bit. The stack manager 120 may program memory cells (for example, MC1_3, MC1_4, MC2_1, and MC2_2) in the middle portion of the plurality of memory stacks (ST1 and ST2) with more bits per a memory cell than other memory cells (for example, MC1_1, MC1_2, MC2_3, and MC2_4). The memory cells in the middle portion of the plurality of memory stacks (ST1 and ST2) may be more stable than other memory cells, and by storing more bits per a memory cell in the memory cells of the middle portion, performance of the nonvolatile memory device 10 may be improved.

In FIG. 17, an example is illustrated in which the first bit and the third bit program modes respectively include a program mode in which 1 bit per a memory cell is programmed and the second bit program mode includes a program mode in which 3 bits per a memory cell are programmed. The first bit and the third bit program modes may also be referred to as a SLC program mode, and the second bit program mode may also be referred to as a TLC program mode. However, this is only an exemplary embodiment, and the first through third bits may be variously determined.

Figure 18:
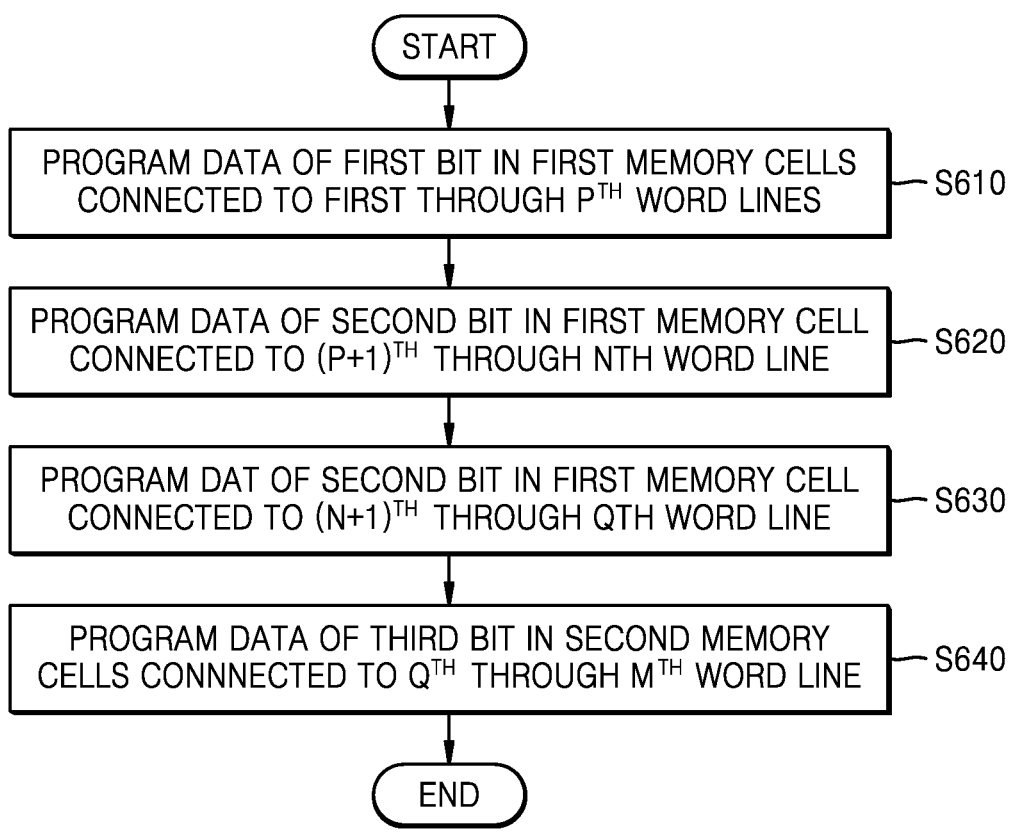
FIG. 18 is a flowchart illustrating an operation of a nonvolatile memory device according to an embodiment.

FIG. 18 is a flowchart illustrating an operation of the nonvolatile memory device 10 according to an embodiment. FIG. 18 illustrates a program method of the nonvolatile memory device 10.

Referring to FIGS. 2 and 18, the first memory stack ST1 may be sequentially connected to the first through $N^{th}$ word lines, and the second memory stack ST2 may be sequentially connected to the $(N+1)^{th}$ through $M^{th}$ word lines. N is an integer of one or greater, and M is an integer greater than N.

The stack manager 120 may program data using the first bit program mode in the first memory cells connected to the first through $p^{th}$ word lines (S610). "p" is equal to or smaller than N. The stack manager 120 may program data using the second bit program mode in the first memory cells connected to the $(p+1)^{th}$ through $N^{th}$ word lines (S620). The stack manager 120 may program data using the second bit program mode in the second memory cells connected to the $(N+1)^{th}$ through $q^{th}$ word lines (S630). "q" is an integer between $(N+2)$ and $(M-2)$ inclusive. The stack manager 120 may program data using the third bit program mode in the second memory cells connected to the $(q+1)^{th}$ through $M^{th}$ word lines (S640). In an embodiment, the second bit program mode may program more bits per a memory cell than the first bit program mode and the second bit program mode. For example, when the second bit program mode is an TLC program mode, each of the first bit program mode and the second bit program mode may include an SLC program mode or an MLC program mode.

Figure 19:
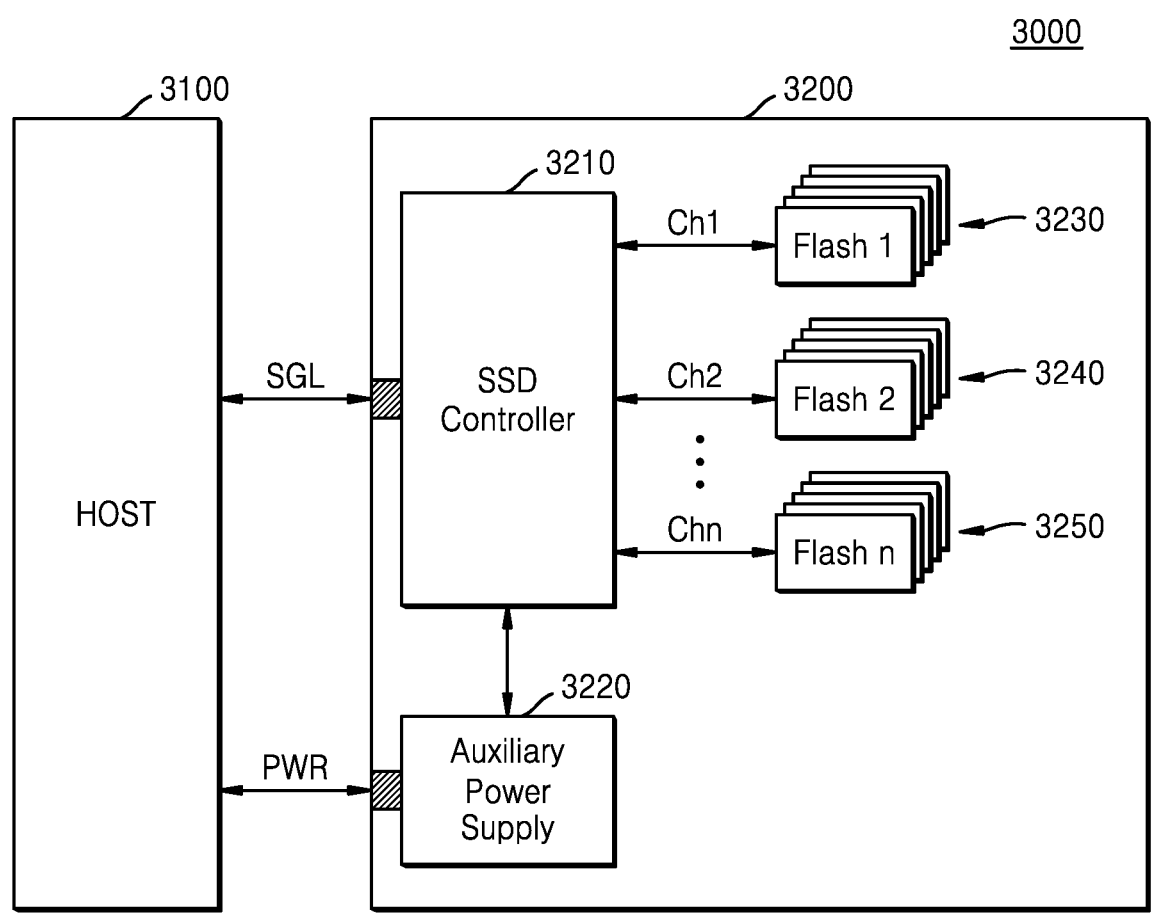
FIG. 19 is a block diagram of an example in which a nonvolatile memory device is applied to a solid state drive (SSD) system according to an embodiment.

FIG. 19 is a block diagram of an example in which a nonvolatile memory device is applied to a solid state drive (SSD) system 3000, according to an embodiment.

Referring to FIG. 19, the SSD system 3000 may include a host 3100 and an SSD 3200. The SSD 3200 may exchange signals with the host 3100 via a signal connector and receive a power via a power connector. The SSD 3200 may include an SSD controller 3210 and a plurality of flash memory devices (3230, 3240, and 3250). Here, the SSD 3200 may be implemented by using embodiments illustrated in FIGS. 1 through 18.

The nonvolatile memory device 10 of FIG. 2 may be applied to at least one of the flash memory devices (3230, 3240, and 3250). Accordingly, at least one of the flash memory devices (3230, 3240, and 3250) may determine applied voltages for other stacks by using the applied voltage for any one of the plurality of memory stacks. In addition, at least one of the flash memory devices (3230, 3240, and 3250) may, in the program operation, perform a program for a memory cell included in a plurality of memory stacks alternately between the plurality of memory stacks, or may program the memory cells on the lower portion of the plurality of memory stacks using an SLC program, for example, the memory cells on the middle portion of the plurality of memory stacks using a TLC program, for example, and the memory cells on the upper portion of the plurality of memory stacks using an SLC program or an MLC program, for example.

A nonvolatile memory device according to embodiments of the inventive concept may be mounted on or applied to not only the SSD 3200 but also a memory card system, a computing system, a universal flash storage (UFS), etc. In addition, an operation method of a nonvolatile memory device according to embodiments of the inventive concept may be applied to various kinds of electronic systems on which the nonvolatile memory device is mounted.

Figure 20:
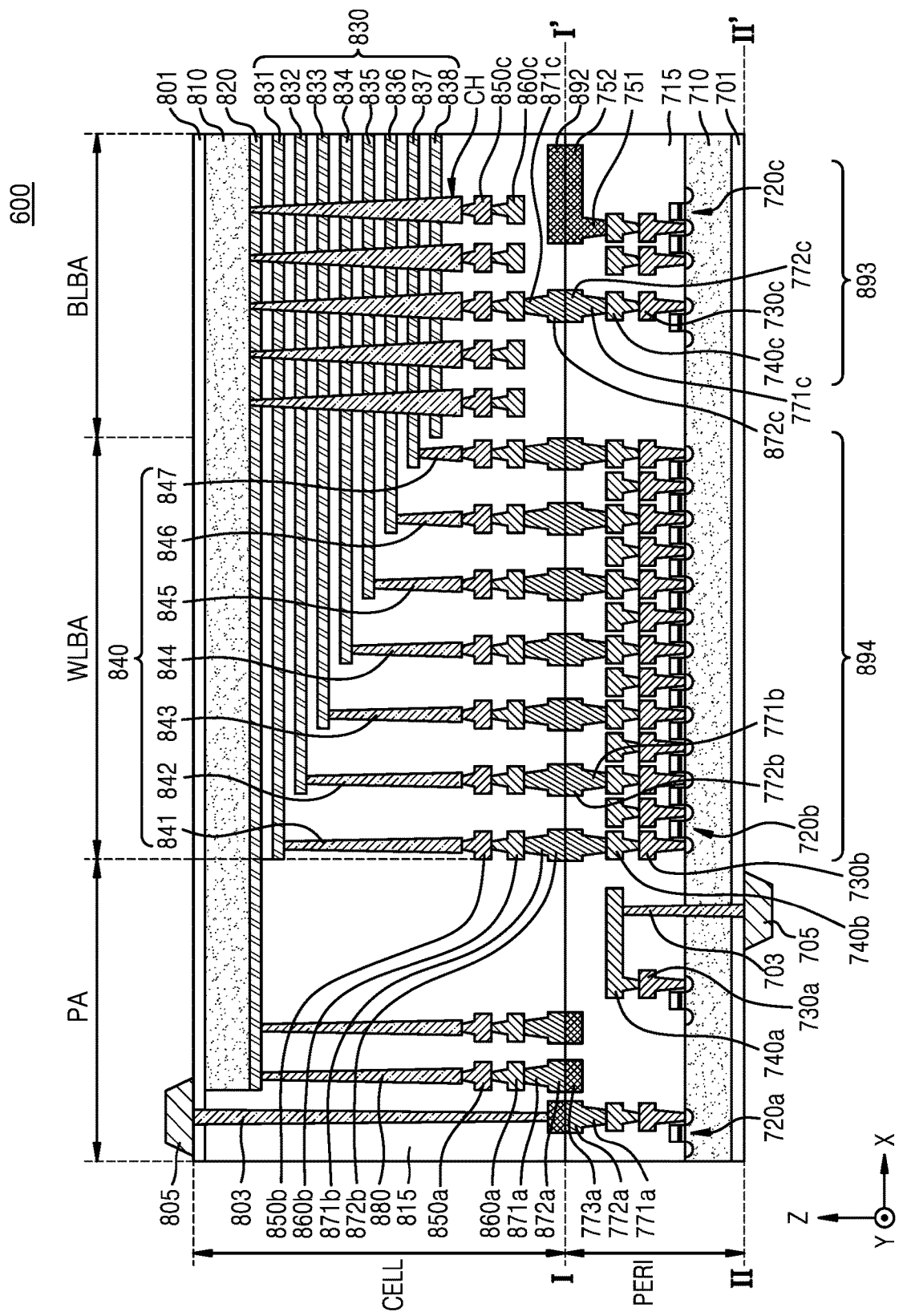
FIG. 20 is a cross-sectional view illustrating the nonvolatile memory device according to an embodiment.

FIG. 20 is a cross-sectional view illustrating the nonvolatile memory device 600, according to an embodiment. The nonvolatile memory device 600 of the FIG. 20 may be an example of the nonvolatile memory device 10 of the FIG. 1.

Referring to FIG. 20, a memory device 600 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, separating the upper chip from the first wafer, separating the lower chip from the second wafer, and then bonding the upper chip and the lower chip with each other. The bonding process may include a method of electrically connecting a bonding metal formed on an uppermost metal layer of the upper chip and a bonding metal formed on an uppermost metal layer of the lower chip. For example, when the bonding metals may include or may be formed of copper (Cu), the bonding may be a Cu-to-Cu bonding. The example embodiment, however, may not be limited thereto. For example, the bonding metals may be formed of aluminum (Al) or tungsten (W).

Each of the peripheral circuit region PERI and the cell region CELL of the memory device 600 may include an external pad bonding area PA, a word line bonding area WLBA, and a bit line bonding area BLBA.

The peripheral circuit region PERI may include a first substrate 710, an interlayer insulating layer 715, a plurality of circuit elements 720a, 720b, and 720c formed on the first substrate 710, first metal layers 730a, 730b, and 730c respectively connected to the plurality of circuit elements 720a, 720b, and 720c, and second metal layers 740a, 740b, and 740c formed on the first metal layers 730a, 730b, and 730c. In an example embodiment, the first metal layers 730a, 730b, and 730c may be formed of tungsten having relatively high electrical resistivity, and the second metal layers 740a, 740b, and 740c may be formed of copper having relatively low electrical resistivity.

In an example embodiment as illustrated in FIG. 20, although only the first metal layers 730a, 730b, and 730c and the second metal layers 740a, 740b, and 740c are shown and described, the example embodiment is not limited thereto, and one or more additional metal layers may be further formed on the second metal layers 740a, 740b, and 740c. At least a portion of the one or more additional metal layers formed on the second metal layers 740a, 740b, and 740c may be formed of aluminum or the like having a lower electrical resistivity than those of copper forming the second metal layers 740a, 740b, and 740c.

The interlayer insulating layer 715 may be disposed on the first substrate 710 and cover the plurality of circuit elements 720a, 720b, and 720c, the first metal layers 730a, 730b, and 730c, and the second metal layers 740a, 740b, and 740c. The interlayer insulating layer 715 may include or may be formed of an insulating material such as silicon oxide, silicon nitride, and the like.

Lower bonding metals 771b and 772b may be formed on the second metal layer 740b in the word line bonding area WLBA. In the word line bonding area WLBA, the lower bonding metals 771b and 772b in the peripheral circuit region PERI may be electrically bonded to upper bonding metals 871b and 872b of the cell region CELL. The lower bonding metals 771b and 772b and the upper bonding metals 871b and 872b may be formed of aluminum, copper, tungsten, or the like. The upper bonding metals 871b and 872b in the cell region CELL may be referred as first metal pads and the lower bonding metals 771b and 772b in the peripheral circuit region PERI may be referred as second metal pads.

The cell region CELL may include at least one memory block. The cell region CELL may include a second substrate 810 and a common source line 820. On the second substrate 810, a plurality of word lines 831 to 838 (i.e., 830) may be stacked in a direction (a Z-axis direction), perpendicular to an upper surface of the second substrate 810. At least one string select line and at least one ground select line may be arranged on and below the plurality of word lines 830, respectively, and the plurality of word lines 830 may be disposed between the at least one string select line and the at least one ground select line.

In the bit line bonding area BLBA, a channel structure CH may extend in a direction (a Z-axis direction), perpendicular to the upper surface of the second substrate 810, and pass through the plurality of word lines 830, the at least one string select line, and the at least one ground select line. The channel structure CH may include a data storage layer, a channel layer, a buried insulating layer, and the like, and the channel layer may be electrically connected to a fifth metal layer 850c, which is at the same level as a fifth metal layer 850b, and a sixth metal layer 860c, which is at the same level as a sixth metal layer 860b. For example, the first metal layer 850c may be a bit line contact, and the sixth metal layer 860c may be a bit line. In an example embodiment, the bit line 860c may extend in a first direction (a Y-axis direction), parallel to the upper surface of the second substrate 810.

In an example embodiment as illustrated in FIG. 20, an area in which the channel structure CH, the bit line 860c, and the like are disposed may be defined as the bit line bonding area BLBA. In the bit line bonding area BLBA, the bit line 860c may be electrically connected to the circuit elements 720c providing a page buffer 893 in the peripheral circuit region PERI. The bit line 860c may be connected to upper bonding metals 871c and 872c in the cell region CELL, and the upper bonding metals 871c and 872c may be connected to lower bonding metals 771c and 772c connected to the circuit elements 720c of the page buffer 893. In an example embodiment, a program operation may be executed based on a page unit as write data of the page-unit is stored in the page buffer 893, and a read operation may be executed based on a sub-page unit as read data of the sub-page unit is stored in the page buffer 893. In the program operation and the read operation, units of data transmitted through bit lines may be different from each other.

In the word line bonding area WLBA, the plurality of word lines 830 may extend in a second direction (an X-axis direction), parallel to the upper surface of the second substrate 810 and perpendicular to the first direction, and may be connected to a plurality of cell contact plugs 841 to 847 (i.e., 840). The plurality of word lines 830 and the plurality of cell contact plugs 840 may be connected to each other in pads provided by at least a portion of the plurality of word lines 830 extending in different lengths in the second direction. The fifth metal layer 850b and th sixth metal layer 860b may be connected to an upper portion of the plurality of cell contact plugs 840 connected to the plurality of word lines 830 which are sequentially stacked on each other. The plurality of cell contact plugs 840 may be connected to the peripheral circuit region PERI by the upper bonding metals 871b and 872b of the cell region CELL and the lower bonding metals 771b and 772b of the peripheral circuit region PERI in the word line bonding area WLBA.

The plurality of cell contact plugs 840 may be electrically connected to the circuit elements 720b forming a row decoder 894 in the peripheral circuit region PERI. In an example embodiment, operating voltages of the circuit elements 720b of the row decoder 894 may be different than operating voltages of the circuit elements 720c forming the page buffer 893. For example, operating voltages of the circuit elements 720c forming the page buffer 893 may be greater than operating voltages of the circuit elements 720b forming the row decoder 894.

A common source line contact plug 880 may be disposed in the external pad bonding area PA. The common source line contact plug 880 may be formed of a conductive material such as metal, a metal compound, polysilicon, and the like, and may be electrically connected to the common source line 820. A third metal layer 850a and a fourth metal layer 860a may be stacked on an upper portion of the common source line contact plug 880. For example, an area in which the common source line contact plug 880, the third metal layer 850a, and the fourth metal layer 860a are disposed may be defined as the external pad bonding area PA.

Input-output pads 705 and 805 may be disposed in the external pad bonding area PA. Referring to FIG. 20, a lower insulating film 701 covering a lower surface of the first substrate 710 may be formed below the first substrate 710, and a first input-output pad 705 may be formed on the lower insulating film 701. The first input-output pad 705 may be connected to at least one of the plurality of circuit elements 720a, 720b, and 720c disposed in the peripheral circuit region PERI through a first input-output contact plug 703, and may be separated from the first substrate 710 by the lower insulating film 701. A side insulating film may be disposed between the first input-output contact plug 703 and the first substrate 710 to electrically separate the first input-output contact plug 703 and the first substrate 710 from each other.

Referring to FIG. 20, an upper insulating film 801 covering the upper surface of the second substrate 810 may be formed on the second substrate 810, and a second input-output pad 805 may be disposed on the upper insulating layer 801. The second input-output pad 805 may be connected to at least one of the plurality of circuit elements 720a, 720b, and 720c disposed in the peripheral circuit region PERI through a second input-output contact plug 803. In an example embodiment, the second input-output pad 805 may be electrically connected to a circuit element 720a.

According to embodiments, the second substrate 810 and the common source line 820 are not disposed in an area in which the second input-output contact plug 803 is disposed. The second input-output pad 805 does not overlap the word lines 830 in the third direction (the Z-axis direction). Referring to FIG. 20, the second input-output contact plug 303 may be separated from the second substrate 810 in a direction, parallel to the upper surface of the second substrate 810, and may pass through the interlayer insulating layer 815 of the cell region CELL to be connected to the second input-output pad 805.

According to embodiments, the first input-output pad 705 and the second input-output pad 805 may be selectively formed. For example, the memory device 600 may include the first input-output pad 705 disposed on the first substrate 710 without having the second input-output pad 805 disposed on the second substrate 810 or the second input-output pad 805 disposed on the second substrate 810 without having the first input-output pad 705 disposed on the first substrate 710. Alternatively, the memory device 600 may include both the first input-output pad 705 and the second input-output pad 805.

A metal pattern provided on an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 600 may include a lower metal pattern 773a, corresponding to an upper metal pattern 872a formed in an uppermost metal layer of the cell region CELL, and having the same cross-sectional shape as the upper metal pattern 872a of the cell region CELL so as to be connected to each other, in an uppermost metal layer of the peripheral circuit region PERI. In the peripheral circuit region PERI, the lower metal pattern 773a formed in the uppermost metal layer of the peripheral circuit region PERI is not connected to a contact. Similarly, in the external pad bonding area PA, an upper metal pattern 872a, corresponding to the lower metal pattern 773a formed in an uppermost metal layer of the peripheral circuit region PERI, and having the same shape as a lower metal pattern 773a of the peripheral circuit region PERI, may be formed in an uppermost metal layer of the cell region CELL.

The lower bonding metals 771b and 772b may be formed on the second metal layer 740b in the word line bonding area WLBA. In the word line bonding area WLBA, the lower bonding metals 771b and 772b of the peripheral circuit region PERI may be electrically connected to the upper bonding metals 871b and 872b of the cell region CELL by a Cu-to-Cu bonding.

Further, in the bit line bonding area BLBA, an upper metal pattern 892, corresponding to a lower metal pattern 752 formed in the uppermost metal layer of the peripheral circuit region PERI, and having the same cross-sectional shape as the lower metal pattern 752 of the peripheral circuit region PERI, may be formed in an uppermost metal layer of the cell region CELL. A contact is not formed on the upper metal pattern 892 formed in the uppermost metal layer of the cell region CELL.

In an example embodiment, a reinforcement metal pattern corresponding to a metal pattern formed in an uppermost metal layer in one of the cell region CELL and the peripheral circuit region PERI and having the same cross-sectional shape as the metal pattern may be formed in an uppermost metal layer in the other one of the cell region CELL and the peripheral circuit region PERI. A contact is not formed on the reinforcement metal pattern.

Figure 21A:
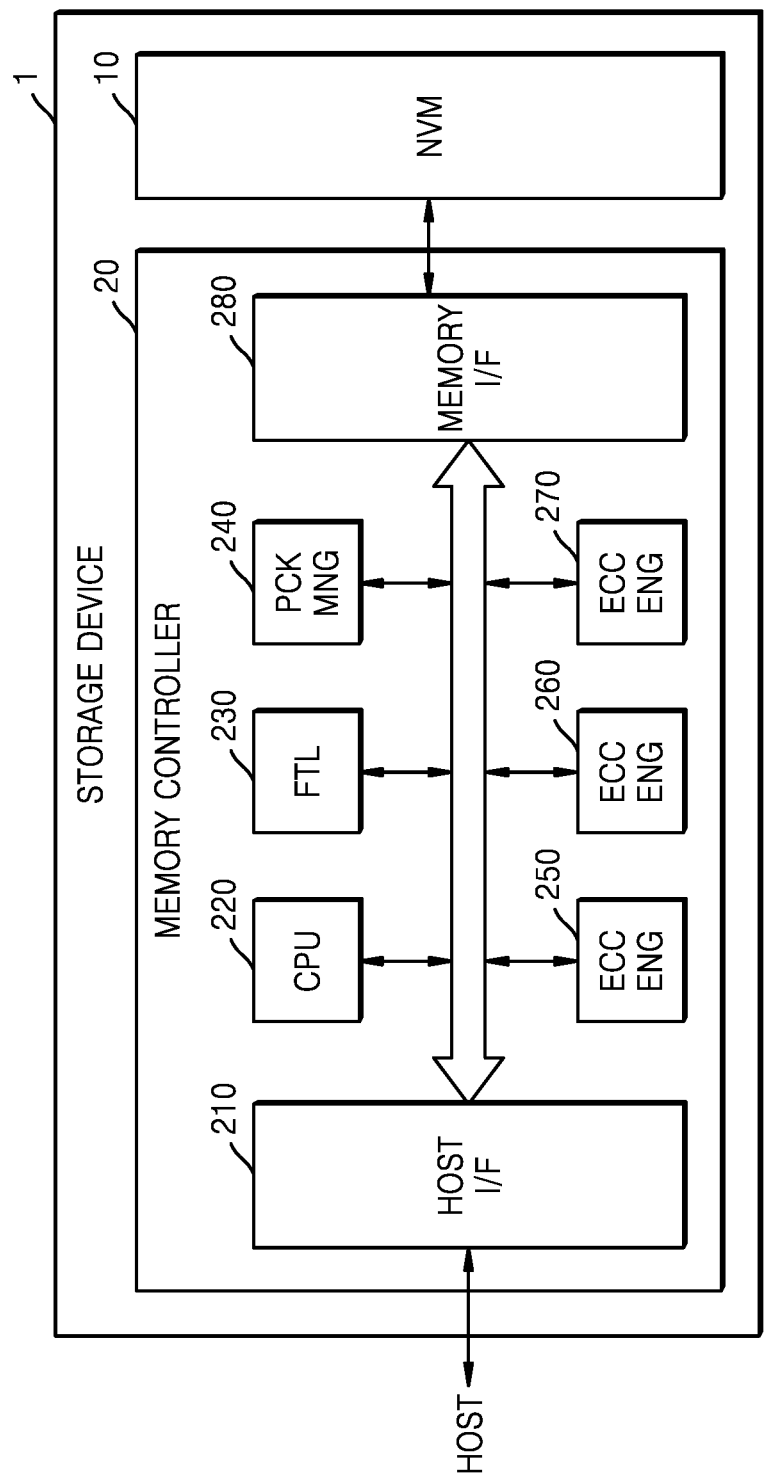
FIG. 21A is a block diagram of a storage device 1 according to an embodiment.

FIG. 21A is a block diagram of a storage device 1 according to an embodiment.

The storage device 1 may include a memory controller 20 and NVM 10. The storage device 1 may communicate with a host.

The storage device 1 may include storage media to store data in response to requests from the host. As an example, the storage device 1 may include at least one of an SSD, an embedded memory, or a removable external memory. When the storage device 1 is an SSD, the storage device 1 may operate according to an NVMe standard. When the storage device 1 is an embedded memory or an external memory, the storage device 1 may operate according to a UFS standard or an eMMC standard. Each of the host and the storage device 1 may generate a packet according to an adopted standard protocol and transmit the packet.

The memory controller 20 may include a host interface 210, a memory interface 280, and a CPU 220. The memory controller 20 may further include a flash translation layer (FTL) 230, a packet manager 240, a buffer memory 250, an error correction code (ECC) engine 260, and an advanced encryption standard (AES) engine 270. The memory controller 20 may further include a working memory (not shown) in which the FTL 230 is loaded. The CPU 220 may execute the FTL 230 to control data write and read operations on the NVM 10.

The host interface 210 may transmit and receive packets to and from the host. A packet transmitted from the host to the host interface 210 may include a command or data to be written to the NVM 10. A packet transmitted from the host interface 210 to the host may include a response to the command or data read from the NVM 10. The memory interface 280 may transmit data to be written to the NVM 10 or receive data read from the NVM 10. The memory interface 280 may operate according to a standard protocol, such as Toggle or open NAND flash interface (ONFI) standard.

The FTL 230 may perform various functions, such as an address mapping operation, a wear-leveling operation, and a garbage collection operation. For example, the FTL may be an intermediate system made up of software (or firmware) and hardware that manages the various functions. The address mapping operation may be an operation of converting a logical address received from the host into a physical address used to actually store data in the NVM 10. The wear-leveling operation may be a technique for preventing excessive deterioration of a specific block by allowing blocks of the NVM 10 to be uniformly used. As an example, the wear-leveling operation may be implemented as firmware that balances erase counts of physical blocks. The garbage collection operation may be a technique for ensuring usable capacity in the NVM 10 by erasing an existing block after copying valid data of the existing block to a new block.

The packet manager 240 may generate a packet according to a protocol of an interface, which consents to the host, or parse various types of information from the packet received from the host. The buffer memory 250 may temporarily store data to be written to the NVM 10 or data to be read from the NVM 10. Although the buffer memory 250 may be a component included in the memory controller 20, the buffer memory 250 may be outside the memory controller 20.

The ECC engine 260 may perform error detection and correction operations on read data read from the NVM 10. The ECC engine 260 may generate parity bits for write data to be written to the NVM 10, and the generated parity bits may be stored in the NVM 10 together with write data. During the reading of data from the NVM 10, the ECC engine 260 may correct an error in the read data by using the parity bits read from the NVM 10 along with the read data, and output error-corrected read data.

The AES engine 270 may perform at least one of an encryption operation and a decryption operation on data input to the memory controller 20 by using a symmetric-key algorithm.

Figure 21B:
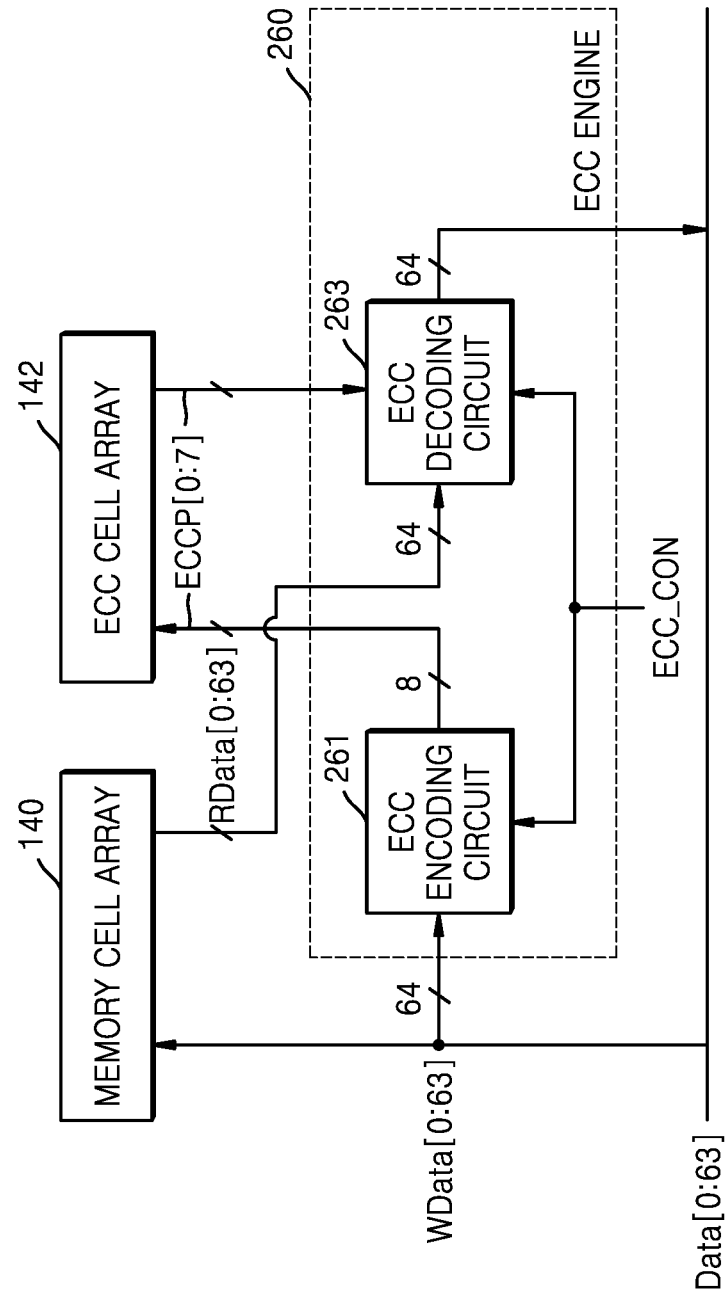
FIG. 21B is a detailed diagram of the ECC engine 260 of FIG. 21A according to an embodiment.

FIG. 21B is a detailed diagram of the ECC engine 260 of FIG. 21A. Referring to FIG. 21B, the ECC engine 260 may include an ECC encoding circuit 261 and an ECC decoding circuit 263. In response to an ECC control signal ECC CON, the ECC encoding circuit 261 may generate parity bits ECCP[0:7] for write data WData[0:63] to be written to memory cells of a memory cell array 140. The parity bits ECCP[0:7] may be stored in an ECC cell array 142. According to embodiments, in response to the ECC control signal ECC CON, the ECC encoding circuit 261 may generate parity bits ECCP[0:7] for write data WData[0:63] to be written to memory cells including a defective cell of the memory cell array 140.

In response to the ECC control signal ECC CON, the ECC decoding circuit 263 may correct error bit data by using read data RData[0:63] which is read from the memory cells of the memory cell array 140 and parity bits ECCP[0:7] which is read from the ECC cell array 142, and may output error-corrected data Data[0:63]. According to embodiments, in response to the ECC control signal ECC CON, the ECC decoding circuit 263 may correct error bit data by using read data RData[0:63] which is read from memory cells including a defective cell of the memory cell array 140 and parity bits ECCP[0:7] which is read from the ECC cell array 142, and may output error-corrected data Data[0:63].

Figure 21C:
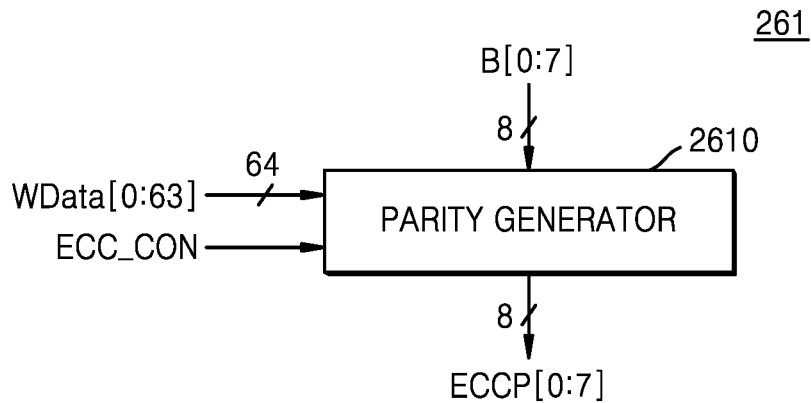
FIG. 21C is a diagram of the ECC encoding circuit 261 of FIG. 21B according to an embodiment.

FIG. 21C is a diagram of the ECC encoding circuit 261 of FIG. 21B.

Referring to FIG. 21C, the ECC encoding circuit 261 may include a parity generator 2610, which receives 64-bit write data WData[0:63] and basis bits B[0:7] in response to an ECC control signal ECC CON and generates parity bits ECCP[0:7] by using an XOR array operation. The basis bits B[0:7] may include an arrangement of bits (e.g., 00000000) for generating parity bits ECCP[0:7] for 64-bit write data WData[0:63]. The basis bits B[0:7] may use other specific bits instead of the example bit arrangement of 00000000.

Figure 21D:
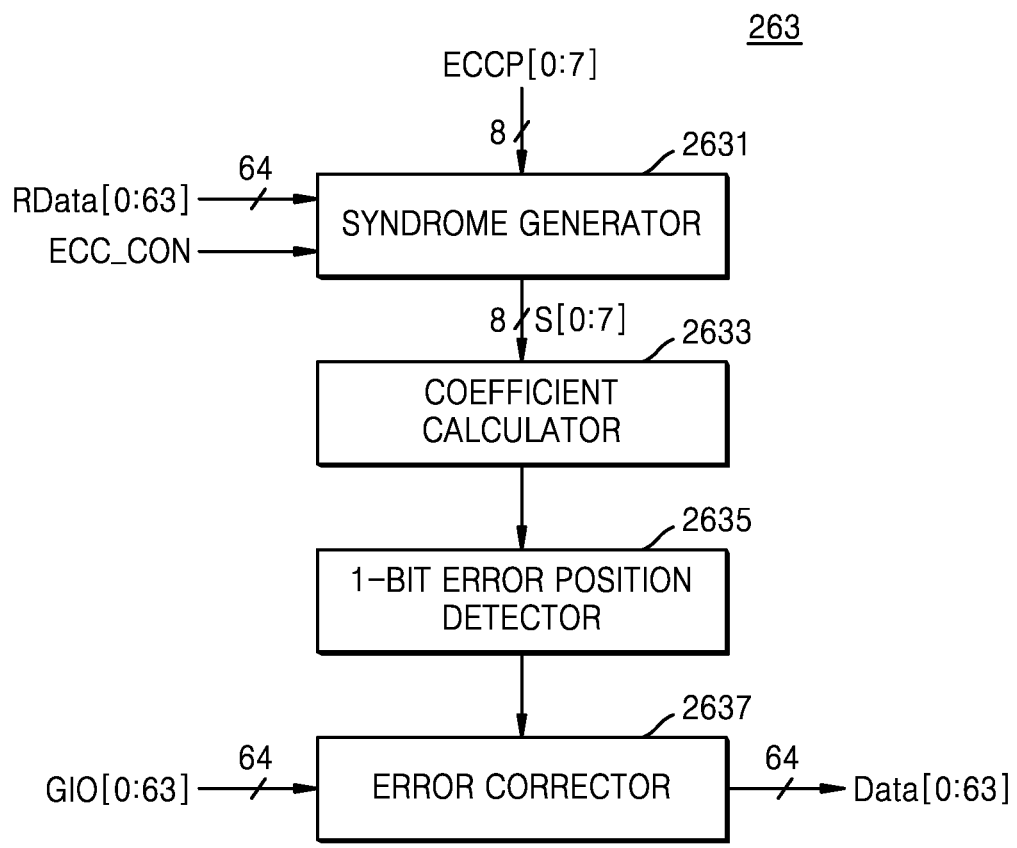
FIG. 21D is a diagram of an ECC decoding circuit 263 of FIG. 21B according to an embodiment.

FIG. 21D is a diagram of an ECC decoding circuit 263 of FIG. 21B.

Referring to FIG. 21D, the ECC decoding circuit 263 may include a syndrome generator 2631, a coefficient calculator 2633, a 1-bit error position detector 2635, and an error corrector 2637. The syndrome generator 2631 may receive 64-bit read data and an 8-bit parity bit ECCP[0:7] in response to an ECC control signal ECC CON and generate syndrome data S[0:7] by using an XOR array operation. The coefficient calculator 2633 may calculate a coefficient of an error position equation by using the syndrome data S[0:7]. The error position equation may be an equation that takes a reciprocal of an error bit as a root. The 1-bit error position detector 2635 may calculate a position of a 1-bit error by using the calculated error position equation. The error corrector 2637 may determine the position of the 1-bit error based on the detection result of the 1-bit error position detector 2635. The error corrector 2637 may correct an error by inverting a logic value of a bit to which an error occurs, from among 64-bit read data RData[0:63], based on the determined 1-bit error position information, and may output error-corrected 64-bit data Data[0:63].

Figure 22:
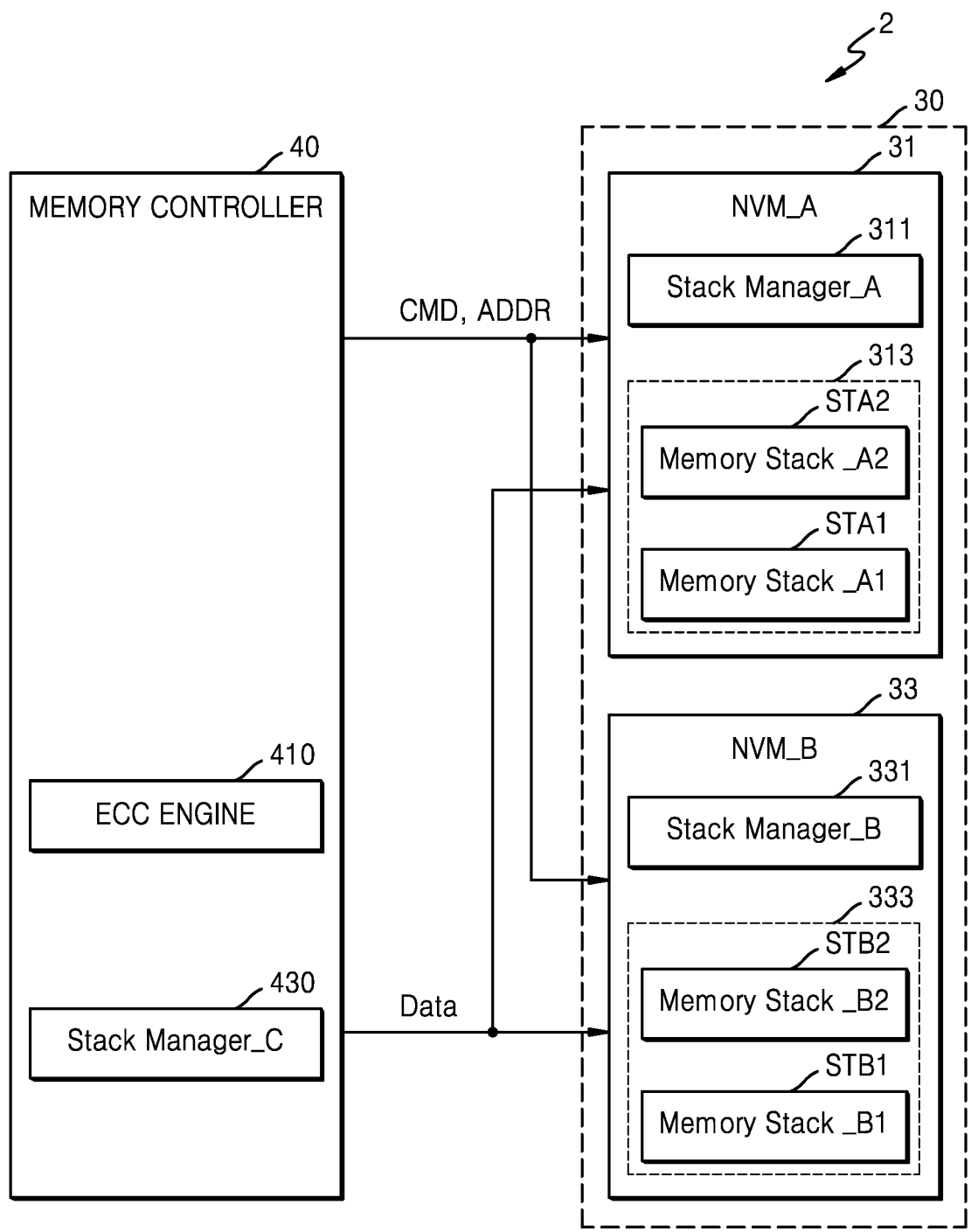
FIG. 22 is a block diagram illustrating a storage device according to an embodiment.

FIG. 22 is a block diagram illustrating a storage device 2 according to an embodiment.

The storage device 2 may include a nonvolatile memory device 30 and a memory controller 40. The storage device 1 as described with reference to FIG. 1 and thereafter may be applied to the storage device 2 in FIG. 22, and because the nonvolatile memory device 10 in FIG. 1 is applicable to the nonvolatile memory device 30 in FIG. 22, and the memory controller 20 in FIG. 1 is applicable to the memory controller 40 in FIG. 22, repeated descriptions thereof are omitted.

The nonvolatile memory device 30 may include a nonvolatile memory device 31 and a nonvolatile memory device 33. According to an exemplary embodiment, the nonvolatile memory device 31 may include a stack manager 311 and a memory cell array 313, and the memory cell array 313 may include a memory stack STA1 and a memory stack STA2. The nonvolatile memory device 33 may include a stack manager 331 and a memory cell array 333, and the memory cell array 333 may include a memory stack STB1 and a memory stack STB2.

The nonvolatile memory device 30 may receive the command CMD, the address ADDR, and data DATA from the memory controller 40. According to an exemplary embodiment, each of the nonvolatile memory device 31 and the nonvolatile memory device 33 may program data DATA to memory cells at a particular address ADDR according to the command CMD, read data DATA, or erase data DATA stored memory cells at a particular address ADDR.

According to an exemplary embodiment, the nonvolatile memory device 31 and the nonvolatile memory device 33 included in the nonvolatile memory device 30 may include separate stack managers 311 and 331, respectively. The stack manager 311 may control a program operation and a read operation on the memory stack STA1 and the memory stack STA2 based on the command CMD. The stack manager 331 may control a program operation and a read operation on the memory stack STB1 and the memory stack STB2 based on the command CMD. The stack manager 311 may determine an applied voltage for one of the memory stacks SATA1 and STA2 (for example, STA2), by using an applied voltage with which a memory cell of the other of the memory stacks STA1 and STA2 (for example, STA1) is successfully read. The stack manager 331 may determine an applied voltage for one of the memory stacks SATB1 and STB2 (for example, STB2), by using an applied voltage with which a memory cell of the other of the memory stacks STB1 and STB2 (for example, STB1) is successfully read. The applied voltage may include a program voltage required for a program operation, and a read voltage required for a read operation.

The memory controller 40 may include an ECC engine 410 and a stack manager 430. The ECC engine 260 may perform the error detection and correction operations on data (for example, read data) read from the nonvolatile memory device 31 and/or the nonvolatile memory device 33. Because the ECC engine 260 in FIGS. 21A and 21B are applicable to the ECC engine 410 in FIG. 22, repeated descriptions thereof are omitted.

According to an exemplary embodiment, the stack manager 430 may determine an applied voltage for another nonvolatile memory device (for example, the nonvolatile memory device 33), by using the applied voltage for any one of the nonvolatile memory device 30 (for example, the nonvolatile memory device 31). For example, the stack manager 430 may command the nonvolatile memory device 31 to apply the second program voltage based on the first program voltage applied to the nonvolatile memory device 33. According to an exemplary embodiment, the first program voltage may be the same as the second program voltage.

Figure 23:
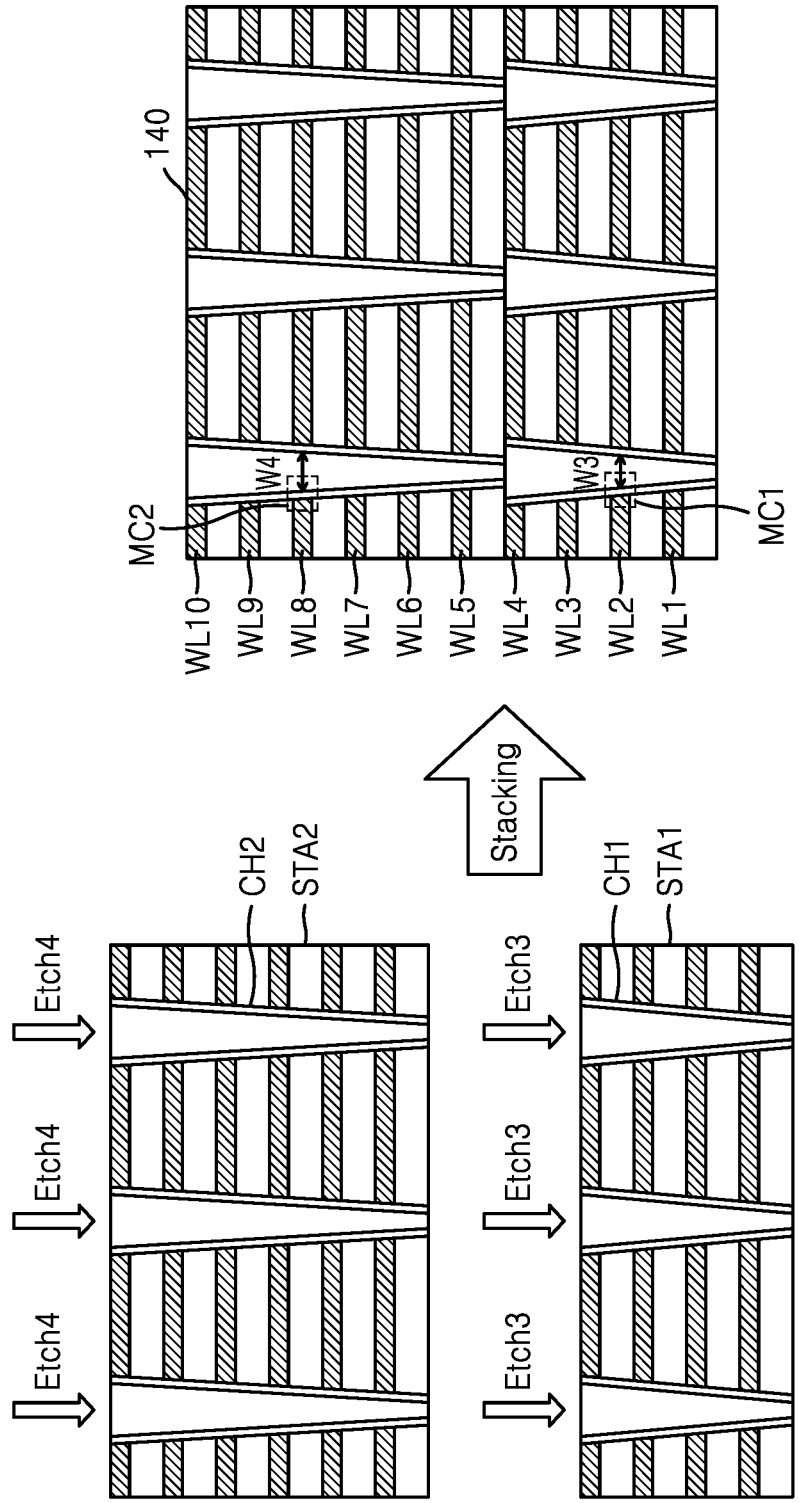
FIG. 23 is a diagram illustrating a method of fabricating a memory cell array according to an embodiment.
Figure 24:
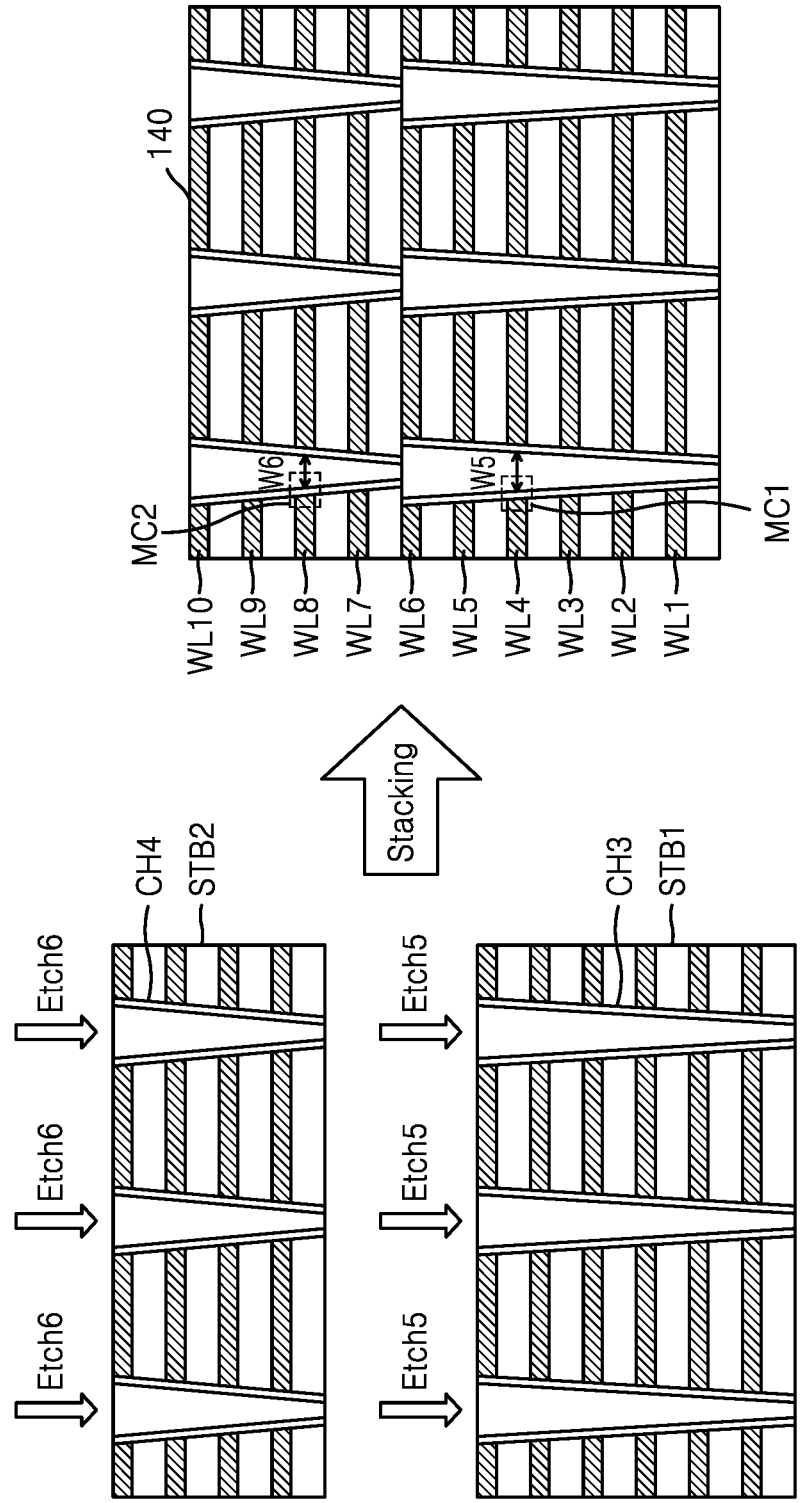
FIG. 24 is a diagram illustrating a method of fabricating a memory cell array according to an embodiment.

FIGS. 23 and 24 are diagrams illustrating a method of forming the memory cell array (313 or 315 in FIG. 22) according to exemplary embodiments. FIGS. 23 and 24 illustrate cross-sections taken along line A-A' in FIG. 4. The descriptions thereof given with reference to FIG. 4 are omitted. Referring to FIG. 23, for simplicity of description, it is assumed that the memory cell array 313 in FIG. 20 is a memory cell array.

A plurality of layers may be generated by a method described with reference to FIG. 4. The memory stack STA1 may be formed by performing a third etching Etch3 on the plurality of layers. In addition, by performing a fourth etching Etch4 on a plurality of layers formed independently of the memory stack STA1, the memory stack STA2 may be formed. The memory cell array 313 of FIG. 22 may be formed by stacking the memory stack STA1 and the memory stack STA2 to connect channel holes CH1 of the memory stack STA1 to channel holes CH2 of the memory stack STA2. The memory stack STA1 may include the first memory cell MC1 connected to the second word line WL2, and the memory stack STA2 may include the second memory cell MC2 connected to the eighth word line WL8. However, while the number of layers of the memory stack STA1 is four, the number of layers of the memory stack STA2 may be six.

Both the memory stack STA1 and the memory stack STA2 may be formed using the same fabrication process including the same etching process. Accordingly, the channel holes CH1 and CH2 included in the memory cells (for example, MC1 and MC2) may have substantially the same width (e.g., third and fourth widths W3 and W4 having substantially the same width) at the same depth from an upper surface of each of the memory stacks STA1 and STA2 where etching of each of the memory stacks STA1 and STA2 starts, and the channel holes CH1 and CH2 may have similar etch profiles at the same depth from the upper surface of each of the memory stacks STA1 and STA2.

For example, the third width W3 of the channel hole CH1 included in the first memory cell MC1 may the same as or similar to the fourth width W4 of the channel hole CH2 included in the second memory cell MC2. Accordingly, due to this characteristic, various operations of the first memory cell MC1 and the second memory cell MC2 may be similar to each other. However, because the number of layers of the memory stack STA2 is six while the number of layers of the memory stack STA1 is four, the memory stack STA1 does not have word lines corresponding to the fifth word line WL5 and the sixth word line WL6 of the memory stack STA2.

A nonvolatile memory device according to the technical idea of the inventive concept may improve program/read operations by performing the program/read operations on the first and second memory stacks STA1 and STA2 by using similar program/read operation characteristics between the memory cells (for example, MC1 and MC2) which are at the same depth form the upper surface of each of the first and second memory stacks STA1 and STA2 where the etching starts. According to an exemplary embodiment, a nonvolatile memory device may determine an applied voltage applied to the memory stack STA2 based on any one of a plurality of applied voltages applied for cell characteristics determination of the memory stack STA1.

Referring to FIG. 24, for simplicity of description, it is assumed that the memory cell array 333 in FIG. 22 is a memory cell array.

The plurality of layers may be formed by the method described with reference to FIG. 4. A memory stack STB1 may be formed by performing a fifth etching Etch5 on the plurality of layers. In addition, a memory stack STB2 may be formed by performing a sixth etching Etch6 on the plurality of layers which have been formed independently of the memory stack STB1. The memory cell array 333 of FIG. 22 may be formed by stacking the memory stack STB1 and the memory stack STB2 to connect the channel holes CH3 of the memory stack STB1 to the channel holes Ch4 of the memory stack STB2. The memory stack STB1 may include the first memory cell MC1 connected to the fourth word line WL4, and the memory stack STB2 may include the second memory cell MC2 connected to the eighth word line WL8. However, the number of layers of the memory stack STB2 may be four, while the number of layers of the memory stack STB1 is six.

Both the memory stack STB1 and the memory stack STB2 may be formed using the same fabrication process including the same etching process. Accordingly, the channel holes CH3 and CH4 included in the memory cells (for example, MC3 and MC4) may have substantially the same width (e.g., fifth and sixth widths having substantially the same width) at the same depth from the upper surface of each of the memory stacks STB1 and STB2 where the etching of each of the memory stacks STB1 and STB2 starts, and the channel holes CH3 and CH4 may form similar etch profiles at the same depth from the upper surface of each of the memory stacks STB1 and STB2.

For example, the fifth width W5 of the channel hole CH3 included in the first memory cell MC1 may be the same as or similar to the sixth width W6 of the channel hole CH4 included in the second memory cell MC2. Thus, various operations of the first memory cell MC1 and the second memory cell MC2 may be similar to each other. However, because the number of layers of the memory stack STB2 is four while the number of layers of the memory stack STB1 is six, the memory stack STB2 does not have word lines corresponding to the first word line WL1 and the second word line WL2 of the memory stack STB1.

A nonvolatile memory device according to the technical idea of the inventive concept may improve program/read operations by performing the program/read operations on the plurality of memory stacks STB1 and STB2 by using similar program/read characteristics between the memory cells (for example, MC3 and MC4) at the same depth from the upper surface of each of the memory stacks STB1 and STB2 where etching starts, and may determine an applied voltage applied to the memory stack STB2 based on any one of a plurality of applied voltages applied for cell characteristics determination for the memory stack STB1.

Figure 25:
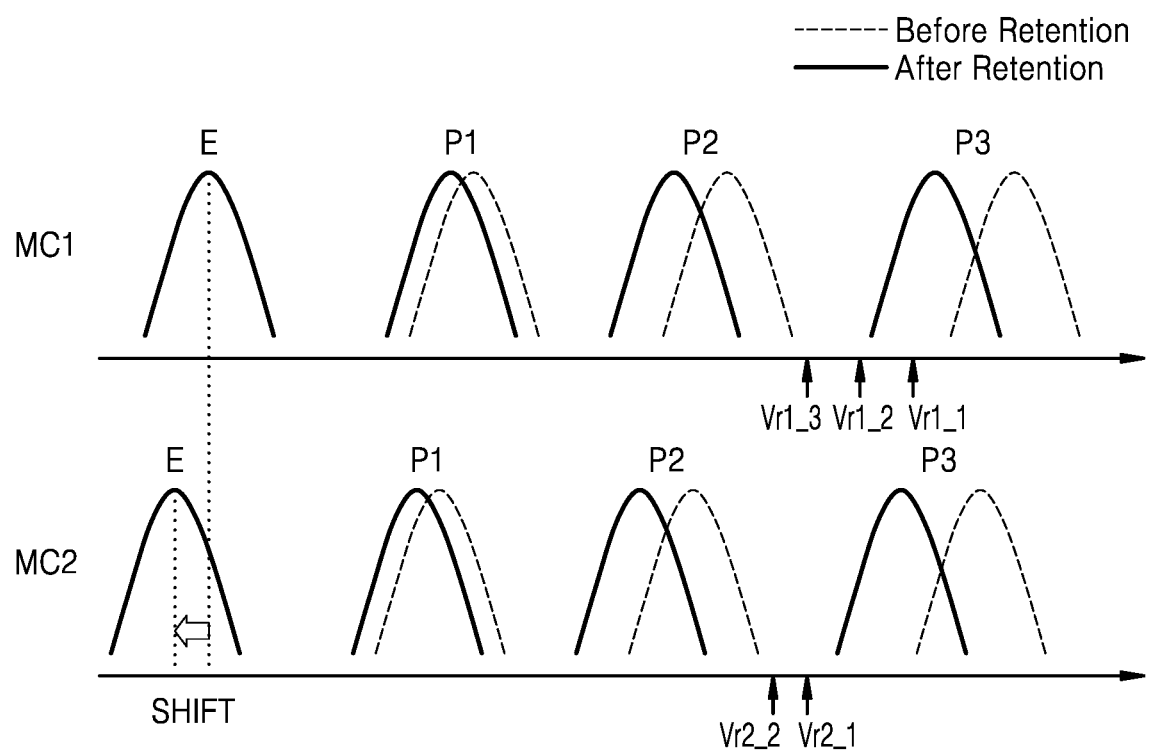
FIG. 25 is a diagram illustrating a cell distribution of a memory cell according to an embodiment.

FIG. 25 is a diagram illustrating a cell distribution of a memory cell according to an exemplary embodiment. The cell distribution of the memory cell as illustrated in FIG. 25 may be partly similar to that as illustrated in FIG. 12, but a cell distribution of the second memory cell MC2 may be shifted in a negative voltage direction. For convenience of description, it is assumed that the nonvolatile memory device 31 is a nonvolatile memory device including the memory cell MC1 or MC2.

Referring to FIGS. 25 and 22 together, the nonvolatile memory device 31 may program the first memory cell MC1 included in the memory stack STA1 and the second memory cell MC2 included in the memory stack STA2 to from the erase state E to any one of the first program state P1 through the third program state P3. As time passes by, a retention phenomenon may occur to the first memory cell MC1 and the second memory cell MC2, and the cell distribution may be changed from a dotted line to a sold line. Accordingly, the nonvolatile memory device 31 may fail in the error correction operation in a read operation for the first memory cell MC1 and the second memory cell MC2, and may perform a read retry operation in which another read operation is performed after changing the read voltage level.

For the read retry operation, the stack manager 311 may apply first through third read voltages $Vr1\_1$ through $Vr1\_3$ to the first memory cell MC1. In an embodiment, the stack manager 311 may sequentially reduce read voltages. For example, the stack manager 311 may apply separately the first read voltage $Vr1\_1$, the second read voltage $Vr1\_2$, and the third read voltage $Vr1\_3$ (where $Vr1\_1 > Vr1\_2 > Vr1\_3$).

The stack manager 311 may succeed in reading by using the third read voltage Vr1_3 of the first through third read voltages Vr1_1 through Vr1_3 (that is, the valley searching).

According to an exemplary embodiment, the stack manager 311 may read the second memory cell MC2 based on the third read voltage Vr1_3. Based on the determined third read voltage Vr1_3, the stack manager 311 may apply at least one applied voltage to the second memory cell MC2 of the memory stack STA2 located at the same depth as the first memory cell MC1 of the memory stack STA1. For example, when a read operation performed on the second memory cell MC2 of the memory stack STA2 fails using the third read voltage Vr1_3, a read retry operation is performed. In an exemplary embodiment, the stack manager 311 may sequentially reduce and apply fourth and fifth read voltages Vr2_1 and Vr2_2 to the second memory cell MC2. For example, the stack manager 311 may apply separately the fourth read voltage Vr2_1 and the fifth read voltage Vr2_2 (wherein Vr2_1>Vr2_2). The stack manager 311 may succeed in reading by using the fifth read voltage Vr2_2.

According to an exemplary embodiment, the number of applied voltages for the second memory cell MC2 of the memory stack STA2 may be reduced, and the read performance may be improved by performing the read operation on the second memory cell MC2 included in the memory stack STA2 based on the third read voltage Vr1_3 that has been determined by using a read retry result for the first memory cell MC1 included in the memory stack STA1.

According to an embodiment, even when the cell distribution of the second memory cell MC2 is shifted in the negative voltage direction with respect to the first memory cell MC1, the read performance may be improved by performing less times the read retry operation for the second memory cell MC2 than the first memory cell MC1.

Figure 26:
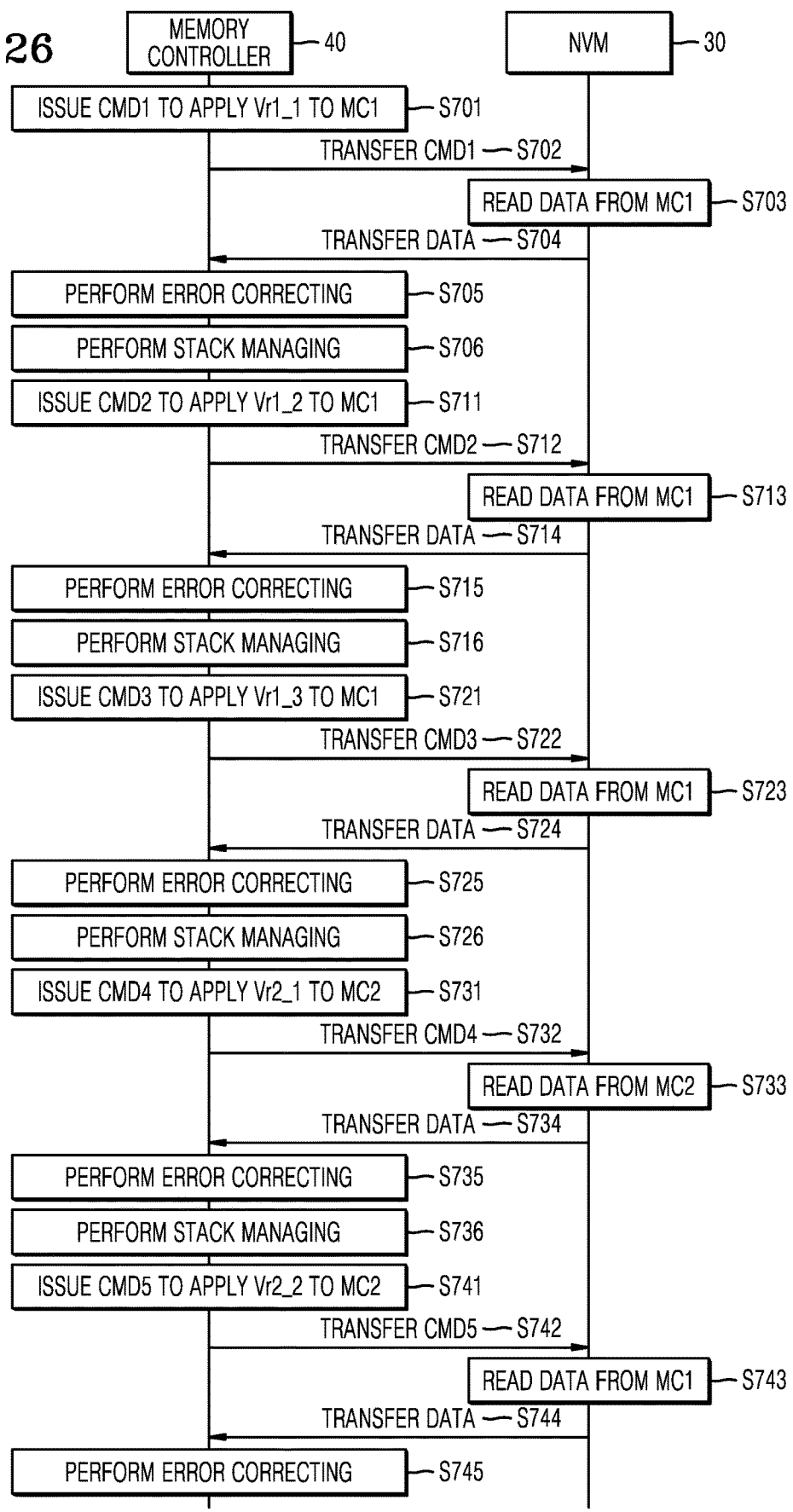
FIG. 26 is a flowchart of an operating method of a storage device according to an embodiment.

FIG. 26 is a flowchart of an operating method of a storage device (2 in FIG. 22) according to an embodiment. FIG. 26 is referred to together with FIG. 22.

The memory controller 40 may issue a first command CMD1 for applying the first read voltage Vr1_1 to the first memory cell MC1 (S701). In an embodiment, the memory controller 40 may perform the read retry operation by using the first through third read voltages Vr1_1 through Vr1_3. According to an exemplary embodiment, the memory controller 40 may issue the first command CMD1 commanding the first read voltage Vr1_1 to be applied to the first memory cell MC1.

The memory controller 40 may transmit the first command CMD1 to the nonvolatile memory device 30 (S702).

The nonvolatile memory device 30 may read data from the first memory cell MC1 (S703). According to an embodiment, the nonvolatile memory device 30 may verify whether data has been properly written in the first memory cell MC1.

The nonvolatile memory device 30 may transmit data DATA read from the first memory cell MC1 to the memory controller 40 (S704).

The memory controller 40 may perform the error correction operation on the received data DATA by using the ECC (S705). When the error correction operation on the read data DATA from the first memory cell MC1 fails, the memory controller 40 may perform the read retry operation.

The stack manager 430 included in the memory controller 40 may perform a stack management operation (S706). The stack manager 430 may output various control signals for controlling the memory stacks STA1, STA2, STB1, and STB2. The stack manager 430 may control to program or read the first memory cell MC1. According to an embodiment, the stack manager 430 may change the read voltage level by applying a read voltage (for example, the second read voltage Vr1_2) at the same voltage level as the first read voltage Vr1_1 to the nonvolatile memory device 30. According to an embodiment, the second read voltage Vr1_2 may have a lower voltage level than the first read voltage Vr1_1.

The memory controller 40 may issue a second command CMD2 for applying the second read voltage Vr1_2 to the first memory cell MC1 (S711). According to an embodiment, the memory controller 40 may issue the second command CMD2 for applying the second read voltage Vr1_2 to the first memory cell MC1.

The memory controller 40 may transmit the second command CMD2 to the nonvolatile memory device 30 (S712).

The nonvolatile memory device 30 may read data from the first memory cell MC1 (S713). According to an embodiment, the nonvolatile memory device 30 may verify whether data has been properly written in the first memory cell MC1.

The nonvolatile memory device 30 may transmit data DATA read from the first memory cell MC1 to the memory controller 40 (S714).

The memory controller 40 may perform the error correction operation on the received data DATA by using the ECC (S715). When the memory controller 40 fails in the error correction operation on data DATA read from the first memory cell MC1, the memory controller 40 may perform the read retry operation.

The stack manager 430 included in the memory controller 40 may change a read voltage level by applying a read voltage (for example, the third read voltage Vr1_3) having the same voltage level as that of the second read voltage Vr1_2 to the nonvolatile memory device 30 (S716). In an exemplary embodiment, the third read voltage Vr1_3 may have a lower voltage level than that of the second read voltage Vr1_2.

The memory controller 40 may issue a third command CMD3 for applying the third read voltage Vr1_3 to the first memory cell MC1 (S721). According to an embodiment, the memory controller 40 may issue the third command CMD3 for applying the third read voltage Vr1_3 to the first memory cell MC1.

The memory controller 40 may transmit the first command CMD3 to the nonvolatile memory device 30 (S722).

The nonvolatile memory device 30 may read data from the first memory cell MC1 (S723). According to an embodiment, the nonvolatile memory device 30 may verify whether data has been properly written in the first memory cell MC1.

The nonvolatile memory device 30 may transmit the data DATA read from the first memory cell MC1 to the memory controller 40 (S724).

The memory controller 40 may perform the error correction operation on the read data DATA by using the ECC (S725). The memory controller 40 may succeed in reading by using the received data DATA. According to an embodiment, the memory controller 40 may succeed in reading by using the third read voltage Vr1_3.

As the stack manager 430 included in the memory controller 40 succeeds in reading, the stack manager 430 may determine a voltage level (e.g., a fourth read voltage Vr2_1) to be applied to another memory stack based on the read voltage that has been successfully read. According to an exemplary embodiment, the stack manager 430 may determine the read voltage (for example, Vr1_3) applied to the first memory cell MC1 included in the memory stack STA1 as a voltage level to be applied to the second memory cell MC2 included in the memory stack STA2 which is located at the same depth as the first memory cell MC1 of the memory stack STA1. The present invention is not limited thereto. For example, the stack manager 430 may apply to the second memory cell MC2 with a read voltage different from the third read voltage Vr1_3, even though the read voltage may have the same voltage level as that of the read voltage (for example, Vr1_1) applied to the first memory cell MC1 included in the memory stack STA1. For another example, the stack manager 430 may apply to the second memory cell MC2 with a read voltage adjusted from the third read voltage Vr1_3. The amount of adjustment may be empirically determined.

The memory controller 40 may issue a fourth command CMD4 for applying the fourth read voltage Vr2_1 to the second memory cell MC2 (S731). According to an embodiment, the memory controller 40 may issue the fourth command CMD4 for applying the fourth read voltage Vr2_1 to the second memory cell MC2. The memory controller 40 may transmit the second command CMD2 to the nonvolatile memory device 30 (S732).

The nonvolatile memory device 30 may read data from the second memory cell MC2 (S733). According to an embodiment, the nonvolatile memory device 30 may verify whether data has been properly written in the second memory cell MC2.

The nonvolatile memory device 30 may transmit data DATA read from the second memory cell MC2 to the memory controller 40 (S734).

The memory controller 40 may perform the error correction operation on the received data DATA by using the ECC (S735). When the error correction operation on the data read from the second memory cell MC2 fails, the memory controller 40 may perform the read retry operation.

The stack manager 430 included in the memory controller 40 may change the read voltage level by applying a read voltage (for example, the fifth read voltage Vr2_2) having a different voltage level from that of the fourth read voltage Vr2_1 to the nonvolatile memory device 30 (S736). According to an embodiment, the fifth read voltage Vr2_2 may have a lower voltage level than that of the fourth read voltage Vr2_1. The memory controller 40 may issue the fifth command CMD5 for applying the fifth read voltage Vr2_1 to the second memory cell MC2 (S741). According to an embodiment, the memory controller 40 may issue the fifth command CMD5 for applying the fifth read voltage Vr2_2 to the second memory cell MC2.

The memory controller 40 may transmit the fifth command CMD5 to the nonvolatile memory device 30 (S742).

The nonvolatile memory device 30 may read data from the second memory cell MC2 (S743). According to an embodiment, the nonvolatile memory device 30 may verify whether data has been properly written in the second memory cell MC2.

The nonvolatile memory device 30 may transmit data DATA read from the second memory cell MC2 to the memory controller 40 (S744).

The memory controller 40 may perform the error correction operation on the received data DATA by using the ECC (S745). When the memory controller 40 fails in the error correction operation on data read from the second memory cell MC2, the memory controller 40 may perform the read retry operation. The memory controller 40 may succeed in reading by using the received data. According to an embodiment, the memory controller 40 may succeed in reading by using the third read voltage Vr1_3. The memory controller 40 may verify the third read voltage Vr1_3 that has been successfully read by using a result of performing the read retry operation on the first memory cell MC1. According to an exemplary embodiment, the memory controller 40 may determine a voltage to be applied to the second memory cell MC2 included in different memory stacks from each other, based on the third read voltage Vr1_3 with which reading of the first memory cell MC1 has succeeded.

According to an embodiment, the number of read retry operations may be reduced by applying a read voltage based on the read voltage determined in any one memory stack (for example, the third read voltage Vr1_3) to another memory stack in which a similar profile has been formed. For example, the fifth read voltage Vr2_2 may be applied to the memory stack STA2 based on the third read voltage Vr1_3 that has been determined in the memory stack STA1. In this case, the number of read retry operations for the memory stack STA1 may be three, but because the number of read retry operations for the memory stack STA2 is two, the number of read retry operations may be relatively reduced, and the read performance may be improved.

FIG. 27 is a table classifying cases of the memory cells MC1 and MC2 which are included in the memory stacks STA1, STA2, STB1, and STB2 according to an embodiment. FIG. 27 is referred to together with FIGS. 22 through 24.

The nonvolatile memory device 30 may include the nonvolatile memory device 31 and the nonvolatile memory device 33. The nonvolatile memory device 31 may include the memory stack STA1 and the memory stack STA2 in the memory cell array 313, and the nonvolatile memory device 33 may include the memory stack STB1 and the memory stack STB2 in the memory cell array 333.

The nonvolatile memory device 30 may be formed by stacking two memory stacks having the same or similar profiles by applying the same fabrication process including the same etching process. In an exemplary embodiment, two stacked memory stacks may have the same number of layers. In an exemplary embodiment, the two stacked memory stacks may have different number of layers from each other.

In a first case CASE1, the first memory cell MC1 may be included in the memory stack STA1, and the second memory cell MC2 may be included in the memory stack STA2. On the contrary, in a second case CASE2, the first memory cell MC1 may be included in the memory stack STA2, and the second memory cell MC2 may be included in the memory stack STA1.

In a third case CASE3, the first memory cell MC1 may be included in the memory stack STB1, and the second memory cell MC2 may be included in the memory stack STB2. On the contrary, in a fourth case CASE4, the first memory cell MC1 may be included in the memory stack STB2, and the second memory cell MC2 may be included in the memory stack STB1.

In a fifth case CASE5, the first memory cell MC1 may be included in the memory stack STA1, and the second memory cell MC2 may be included in the memory stack STB2. On the contrary, in a sixth case CASE6, the first memory cell MC1 may be included in the memory stack STB2, and the second memory cell MC2 may be included in the memory stack STA1.

In a seventh case CASE7, the first memory call MC1 may be included in the memory stack STB1, and the second memory cell MC2 may be included in the memory stack STA2. On the contrary, in an eighth case CASE8, the first memory cell MC1 may be included in the memory stack STA2, and the second memory cell MC2 may be included in the memory stack STB1.

As described above, embodiments have been disclosed in the drawings and the specification. While the embodiments have been described herein with reference to specific terms, it should be understood that they have been used only for the purpose of describing the technical idea of the inventive concept and not for limiting the scope of the inventive concept as defined in the claims. Thus, those with ordinary skill in the art will appreciate that various modifications and equivalent embodiments are possible without departing from the scope of the inventive concept. Therefore, the true scope of protection of the inventive concept should be determined by the technical idea of the appended claims.

What is claimed is:

1. An operating method of a storage device comprising a nonvolatile memory device comprising a first memory stack and a second memory stack, and a memory controller coupled to control the nonvolatile memory device, the operating method comprising:
    determining a first read voltage level with which a first memory cell of the first memory stack is successfully read; and
    performing a read operation on a second memory cell of the second memory stack using a second read voltage determined based on the first read voltage level.

2. The operating method of claim 1,
    wherein the first read voltage level is equal to a voltage level of the second read voltage.

3. The operating method of claim 1,
    wherein the determining of the first read voltage level comprises:
    applying, by the nonvolatile memory device, sequentially a plurality of first read voltages to the first memory cell of the first memory stack;
    reading, by the nonvolatile memory device, data of the first memory cell after applying each of the plurality of first read voltages.

4. The operating method of claim 1,
    wherein the performing of the read operation on the second memory cell of the second memory stack comprises:
    applying, by the nonvolatile memory device, the second read voltage to the second memory cell of the second memory stack; and
    reading, by the nonvolatile memory device, data of the second memory cell using the second read voltage.

5. The operating method of claim 1,
    wherein the second memory stack is stacked on the first memory stack.

6. The operating method of claim 1,
    wherein the nonvolatile memory device comprises:
    a first memory comprising the first memory stack; and
    a second memory comprising the second memory stack.

7. The operating method of claim 3, further comprising:
    transmitting, by the memory controller, to the nonvolatile memory device a command for reading the first memory cell based on a read voltage of the plurality of first read voltages which are sequentially applied;
    transmitting, by the nonvolatile memory device, data of the first memory cell to the memory controller; and
    verifying, by the memory controller, whether an error has occurred in data of the first memory cell which are read using the read voltage.

8. The operating method of claim 7,
    wherein the verifying of whether the error has occurred comprises:
    when the data which are read using the read voltage is determined as having no error, determining, by the memory controller, a voltage level of the read voltage as the first read voltage level; and
    when the data which are read using the read voltage is determined as having an error, determining, by the memory controller, the next read voltage of the plurality of first read voltages which are sequentially applied as a read voltage for the next read operation to be performed on the first memory cell of the first memory stack, and
    wherein a voltage level of the next read voltage is lower than the voltage level of the read voltage.

9. The operating method of claim 1, further comprising:
    generating a plurality of second read voltages including the second read voltage;
    transmitting, by the memory controller, to the nonvolatile memory device a command to read the second memory cell based on a read voltage of the plurality of second read voltages which are sequentially applied;
    transmitting, by the nonvolatile memory device, data of the second memory cell to the memory controller; and
    verifying, by the memory controller, whether an error has occurred in data of the second memory cell which are read using the read voltage.

10. The operating method of claim 9,
    wherein the verifying of where the error has occurred comprising:
    when the data which are read using the read voltage is determined as having no error, determining, by the memory controller, a voltage level of the read voltage of the second memory cell as a third voltage level; and
    when the data which are read using the read voltage is determined as having an error, determining, by the memory controller, the next read voltage of the plurality of second read voltages which are sequentially applied as a read voltage for the next read operation to be performed on the second memory cell of the second memory stack, and
    wherein a voltage level of the next read operation is lower than the voltage level of the read voltage.

11. A nonvolatile memory device comprising:
    a first memory stack comprising a plurality of first word lines stacked on each other, wherein the number of the plurality of first word lines is K which is a natural number;
    a second memory stack comprising a plurality of second word lines stacked on each other, the second memory stack being stacked vertically on the first memory stack, and the number of the plurality of second word lines being N which is a natural number greater than K; and
    a control logic configured to apply a second operating voltage to a second memory cell which is located at a first depth from an upper surface of the second memory stack,
    wherein the second operating voltage is determined based on a first operating voltage applied to a first memory cell which is located at the first depth from an upper surface of the first memory stack.

12. The nonvolatile memory device of claim 11,
    wherein the first memory stack is provided with a first contact hole which extends from the upper surface of the first memory stack to a bottom surface of the first memory stack and penetrates the plurality of first word lines,
    wherein the first memory cell is formed at a boundary between the first contact hole and one of the plurality of first word lines,
    wherein the second memory stack is provided with a second contact hole which extends from the upper surface of the second memory stack to a bottom surface of the second memory stack and penetrates the plurality of second word lines, wherein the second memory cell is formed at a boundary between the second contact hole and one of the plurality of second word lines, and wherein the first contact hole of the first memory stack and the second contact hole of the second memory stack have similar etch profiles which are formed by an identical etching process.

13. The nonvolatile memory device of claim 11, wherein the control logic is configured to apply at least one operating voltage to $(K+1)^{th}$ through $(K+N)^{th}$ word lines of the second memory stack, and wherein the at least one operating voltage is determined independently of the first operating voltage.

14. The nonvolatile memory device of claim 11, wherein the plurality of first word lines of the first memory stack comprises first through Kth word lines sequentially from the upper end thereof, wherein the plurality of second word lines of the second memory stack comprises $(K+1)^{th}$ through $(K+N)^{th}$ word lines sequentially from the upper end thereof, and wherein the control logic is configured to apply a fourth operating voltage to $(K+1)^{th}$ through $(2K)^{th}$ word lines, based on a third operating voltage applied to the first through Kth word lines.

15. The nonvolatile memory device of claim 14, wherein the control logic is configured to apply a fifth operating voltage to $(2K+1)^{th}$ through the $(K+N)^{th}$ word lines, and wherein the fifth operating voltage is determined independently of the third operating voltage.

16. A nonvolatile memory device comprising:

a first memory stack comprising a plurality of first word lines stacked on each other, wherein the number of the plurality of first word lines is N;

a second memory stack comprising a plurality of second word lines stacked on each other, the second memory stack being stacked vertically on the first memory stack and the number of the plurality of second word lines being K which is a natural number less than N; and a control logic configured to apply a second operating voltage to a second memory cell which is located at a second depth from an upper surface of the second memory stack, wherein the second operating voltage is determined based on a first operating voltage applied to a first memory cell which is located at the second depth from an upper surface of the first memory stack.

17. The nonvolatile memory device of claim 16, wherein the first memory stack is provided with a first contact hole which extends from the upper surface of the first memory stack to a bottom surface of the first memory stack and penetrates the plurality of first word lines, wherein the first memory cell is formed at a boundary between the first contact hole and one of the plurality of first word lines, wherein the second memory stack is provided with a second contact hole which extends from the upper surface of the second memory stack to a bottom surface of the second memory stack and penetrates the plurality of second word lines, wherein the second memory cell is formed at a boundary between the second contact hole and one of the plurality of second word lines, and wherein the first contact hole of the first memory stack and the second contact hole of the second memory stack have similar etch profiles which are formed by an identical etching process.

18. The nonvolatile memory device of claim 17, wherein a depth of the first contact hole is greater than a depth of the second contact hole.

19. The nonvolatile memory device of claim 16, wherein the plurality of first word lines of the first memory stack comprises first through $N^{th}$ word lines, wherein the plurality of second word lines of the second memory stack comprises $(N+1)^{th}$ through $(N+K)^{th}$ word lines, and wherein the control logic is configured to apply a seventh operating voltage to $(N+1)^{th}$ through the $(N+K)^{th}$ word lines, based on a sixth operating voltage applied to the first through Kth word lines.

20. The nonvolatile memory device of claim 19, wherein the control logic is configured to apply an eighth operating voltage to $(K+1)^{th}$ through $N^{th}$ word lines, and wherein the eighth operating voltage is determined independently of the sixth operating voltage.

* * * * *